(12) United States Patent
Van Zyl

(10) Patent No.: US 12,355,418 B2
(45) Date of Patent: Jul. 8, 2025

(54) TWO STAGE PIN DIODE DRIVER WITH ENERGY RECOVERY

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 260 days.

(21) Appl. No.: 17/978,158

(22) Filed: Oct. 31, 2022

(65) Prior Publication Data

US 2023/0140703 A1    May 4, 2023

Related U.S. Application Data

(60) Provisional application No. 63/274,123, filed on Nov. 1, 2021.

(51) Int. Cl.
*H03K 17/74* (2006.01)
*H01J 37/32* (2006.01)
*H03H 7/40* (2006.01)

(52) U.S. Cl.
CPC ......... *H03H 7/40* (2013.01); *H01J 37/32183* (2013.01); *H03K 17/74* (2013.01)

(58) Field of Classification Search
CPC ...... H03K 17/74; H03K 17/567; H03K 17/58; H03H 7/40; H01J 37/32183

USPC .......................... 327/108, 109, 111, 112, 503
See application file for complete search history.

(56) References Cited

U.S. PATENT DOCUMENTS 10,742,212 B2 *    8/2020    Van Zyl ............... H03K 17/567
11,374,565 B2 *    6/2022    Van Zyl ................ H03K 17/74

OTHER PUBLICATIONS

Shane Thomas, International Search Report and Written Opinion, Mar. 17, 2023, PCT/US22/48545, International Search Authority, Alexandria, Virginia.
C. Van Niekerk and P. Van der Walt, "High-speed high-voltage PIN diode driver," Proceedings of the 1998 South African Symposium on Communications and Signal Processing—COMSIG '98 (Cat. No. 98EX214), 1998, pp. 387-392, doi: 10.1109/COMSIG.1998.736988.

* cited by examiner

*Primary Examiner* — Hai L Nguyen
(74) *Attorney, Agent, or Firm* — NOD Law PC

(57) ABSTRACT

This disclosure describes systems, methods, and apparatus for a two-stage PIN diode driver. The first stage can charge and discharge the PIN diode via a resonant circuit, for instance via a power supply in series with switches and an inductor or other inductive component, while the second stage, or holding stage includes both a first holding supply for maintaining a forward bias current through the PIN diode and a second holding supply for maintaining a reverse bias voltage over the PIN diode.

41 Claims, 22 Drawing Sheets

TWO STAGE PIN DIODE DRIVER WITH ENERGY RECOVERY

CLAIM OF PRIORITY UNDER 35 U.S.C. § 119

The present Application for Patent claims priority to Provisional Application No. 63/274,123 entitled "TWO STAGE PIN DIODE DRIVER WITH ENERGY RECOVERY" filed Nov. 1, 2021, and assigned to the assignee hereof and hereby expressly incorporated by reference herein.

FIELD OF THE DISCLOSURE

The present disclosure relates generally to diode driver circuits, and more particularly to a PIN diode driver that employs a two-stage circuit.

DESCRIPTION OF RELATED ART

PIN diodes are electrical devices having an un-doped or lightly doped intrinsic (I) semiconductor region sandwiched between heavily doped regions, and have various applications, for instance, as switching devices in impedance matching networks, and especially in radio-frequency (RF) match networks.

The "PIN" designation derives from the three-part sandwich structure of this diode: a lightly doped intrinsic region (I) sandwiched between a heavily doped p-type semiconductor (P) and a heavily doped n-type semiconductor (N). In general, PIN diodes obey conventional diode behavior at low frequency input signals, but for higher frequency input signals they operate as a resistor in the forward biased or on-state, and as a small capacitor in the reverse biased or off-state. As such, PIN diodes are often utilized in attenuators, fast switches, radio frequency (RF) applications, and high voltage electronic applications where high isolation and low loss are desired.

In one particular implementation, PIN diodes are used in an impedance match network configured to match a changing load impedance of a plasma load to a desired impedance (e.g., 50 ohm) into which a high-power RF generator can efficiently deliver power. In such an implementation, the PIN diodes serve to connect or disconnect reactive components, typically capacitors, of the impedance matching network to quickly alter the properties of the matching network by switching the reactive elements in and out of the network. Regardless of the specific use, high-speed switching of PIN diodes may involve high power consumption each switch cycle, which is exacerbated in devices using multiple PIN diodes.

Moreover, driving high power PIN diodes at high speeds as required for PIN diode matches and switches is a difficult problem. Under forward bias conditions, the diode stores charge in its intrinsic region. To quickly remove this charge requires high voltage but discharging this charge from a high voltage supply takes a lot of energy. In order to recover stored energy rather than supplying and then dumping the energy, resonant circuits can be used. But resonant circuits create a dangerous situation where the PIN diode snaps off when the charge is finally extracted from the PIN diode. This sudden turn-off of the current through the PIN diode creates high voltages across the PIN diode if driven through an inductor (as is typical for energy recovery) which can lead to PIN diode failure. It is with these observations in mind, among others, that aspects of the present disclosure were conceived.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Aspects of the present disclosure generally relate to apparatus, systems and methods for radio-frequency (RF) switching circuits, and more particularly for a PIN diode driver circuit for high speed, high repetition rate and/or high power applications. In one example, the drive circuit includes a two-stage drive circuit, and in another example includes a two-stage drive circuit in combination with one or more low voltage reverse bias supplies. In PIN diode driver circuits incorporating one or more low voltage reverse bias supplies, a lower voltage, or voltages, intended to clear charge from the intrinsic region but using relatively little power to do so, is applied first before applying a higher voltage that holds a reverse bias on the PIN diode once the intrinsic region is largely cleared of charge.

In some aspects, the techniques described herein relate to a method for driving a PIN diode where the driving includes changing a voltage, V, of a controlled node connected to a PIN diode from a first voltage, V1, to a second voltage, V2, and from V2 to V1, the method including: changing from V1 to V2, wherein changing from V1 to V2 includes: disconnecting the controlled node from a first holding power supply by breaking a first connection, connecting the controlled node to a mid-voltage power supply through a first resonant circuit via a second connection, maintaining the second connection until the first resonant circuit causes the current from the mid-voltage power supply to reverse direction, breaking the second connection as soon as the current reverses direction, and connecting the controlled node to a second holding supply via a third connection after the second connection to the mid-voltage supply has been broken; and changing from V2 to V1, wherein changing from V2 to V1 includes: disconnecting the controlled node from the second holding power supply by breaking the third connection, connecting the controlled node to the mid-voltage power supply through a second resonant circuit via a fourth connection, maintaining the fourth connection until the second resonant circuit causes the current from the mid-voltage power supply to reverse direction, breaking the fourth connection as soon as the current reverses direction, and connecting the controlled node to the first holding supply via the first connection after the fourth connection to the mid-voltage power supply has been broken.

In some aspects, the techniques described herein relate to a method, wherein the first and second resonant circuits are the same circuit.

In some aspects, the techniques described herein relate to a method, wherein the first and second resonant circuits have at least one component that is not common between them.

In some aspects, the techniques described herein relate to a method, wherein in the changing from V1 to V2 the mid-voltage power supply delivers energy, and in the changing from V2 to V1 the mid-voltage power supply recovers energy.

In some aspects, the techniques described herein relate to a method, wherein in the changing from V2 to V1 the mid-voltage power supply delivers energy, and in the changing from V1 to V2 the mid-voltage power supply recovers energy.

In some aspects, the techniques described herein relate to a method, wherein energy is recovered to the first or second holding power supply shortly before the current from the mid-voltage power supply reverses direction.

In some aspects, the techniques described herein relate to a method, wherein a power converter is connected between an output of the first holding supply and a power sink.

In some aspects, the techniques described herein relate to a method, wherein the power sink is an output of the mid-voltage power supply.

In some aspects, the techniques described herein relate to a method, wherein a power converter is connected between an output of the second holding supply and a power sink.

In some aspects, the techniques described herein relate to a method, wherein the power sink is the output of the mid-voltage power supply.

In some aspects, the techniques described herein relate to a method, wherein the controlled node is connected to a PIN diode through a radio frequency (RF) blocking circuit that provides a low impedance to direct current (DC) current and attenuates transmission of RF power through the RF blocking device.

In some aspects, the techniques described herein relate to a method, further including, after disconnecting the controlled node from the first holding power supply and before connecting the controlled node to the mid-voltage power supply through the first resonant circuit, connecting one or more low voltage reverse bias supplies to the controlled node in a sequence of increasing voltage when changing from V1 to V2.

In some aspects, the techniques described herein relate to a method, wherein each of the low voltage supplies disconnect from the controlled node if current drawn from a respective low-voltage power supply reverses direction.

In some aspects, the techniques described herein relate to a method, wherein one of the one or more low voltage reverse bias supplies is at least partially coupled between the first holding supply and the controlled node.

In some aspects, the techniques described herein relate to a method, wherein the RF blocking circuit connects the controlled node to a cathode of the PIN diode, the output of the first holding supply is a negative current when the first holding supply is connected to the controlled node and a negative voltage when the first holding supply is not connected to the controlled node.

In some aspects, the techniques described herein relate to a method, wherein an output of the mid-voltage power supply is a positive voltage, but less positive than an output of the second holding supply.

In some aspects, the techniques described herein relate to a method, wherein the RF blocking circuit connects the controlled node to an anode of the PIN diode, the output of the first holding supply is a positive current when the first holding supply is connected to the controlled node and a positive voltage when the first holding supply is not connected to the controlled node.

In some aspects, the techniques described herein relate to a method, wherein an output of the mid-voltage power supply is a negative voltage, but less negative than an output of the second holding supply.

In some aspects, the techniques described herein relate to a method, wherein a magnitude of current provided by the first holding supply is increased for a short time after connecting the controlled node to the first holding supply.

In some aspects, the techniques described herein relate to a method, wherein the short time is between 1 microsecond and 100 microseconds, and a magnitude of the current is increased to a level between 2 and 100 times a magnitude of the current after the short time has elapsed.

In some aspects, the techniques described herein relate to a method for driving a PIN diode, the method including: controllably charging and discharging the PIN diode to place the PIN diode in an OFF state and an ON state, respectively; recovering stored energy when the PIN diode is discharged; and holding a voltage across a series combination of the PIN diode and a RF blocking device with a holding supply when the PIN diode turns to the OFF state, where the RF blocking device primarily passes DC current and primarily attenuates RF power.

In some aspects, the techniques described herein relate to a method, further including: increasing forward current through the PIN diode above a baseline forward current for a short time after discharging the PIN diode.

In some aspects, the techniques described herein relate to a method, further including charging and discharging the PIN diode with a single mid-voltage power supply.

In some aspects, the techniques described herein relate to a method, further including providing one or more low voltage reverse bias supplies for charging the PIN diode from a voltage substantially lower than that of the holding supply.

In some aspects, the techniques described herein relate to a method, further including: recovering energy to the holding supply.

In some aspects, the techniques described herein relate to a method, further including transferring power from the holding supply to the mid-voltage supply via a power converter.

In some aspects, the techniques described herein relate to a method wherein a capacitor is operably coupled with the PIN diode as part of a match network, the PIN diode connecting the capacitor in the match network when discharged and disconnecting the capacitor from the match network when charged, the energy recovered further including energy stored in the capacitor.

In some aspects, the techniques described herein relate to an apparatus including: charge-discharge circuitry configured to charge and discharge a PIN diode to place the PIN diode in an OFF state and an ON state, respectively. an energy recovery component configured to recover stored energy when the PIN diode is discharged; and a holding stage incorporating a holding supply configured to hold a voltage across a series combination of the PIN diode and a RF blocking device when the PIN diode is in the OFF state, where the RF blocking device primarily passes DC current and primarily attenuates RF power.

In some aspects, the techniques described herein relate to an apparatus, further including: a current booster configured to boost current directly after discharging the PIN diode.

In some aspects, the techniques described herein relate to an apparatus, further including a mid-voltage power supply coupled to the charge-discharge circuitry and configured to provide current to the PIN diode through the charge-discharge circuitry and the RF blocking device.

In some aspects, the techniques described herein relate to an apparatus, further including: recovering energy to the holding supply.

In some aspects, the techniques described herein relate to an apparatus, further including a power converter coupled between the holding supply and the mid-voltage supply to transfer power from the holding supply to the mid-voltage supply using the energy recovered to the holding supply.

In some aspects, the techniques described herein relate to an apparatus, further including one or more low voltage reverse bias supplies for charging the PIN diode from a voltage substantially lower than that of the holding supply.

In some aspects, the techniques described herein relate to an apparatus, further including a capacitor operably coupled with the PIN diode as part of a match network, the PIN diode connecting the capacitor in the match network when discharged and disconnecting the capacitor from the match network when charged, the energy recovered further including energy stored in the capacitor.

In some aspects, the techniques described herein relate to an apparatus, the holding stage further including a second holding supply configured to conduct current through the PIN diode and a RF blocking device when the PIN diode turns to the on state.

In some aspects, the techniques described herein relate to a non-transitory, tangible processor-readable storage medium, encoded with processor readable instructions to perform a method for driving a PIN diode, the method including: charging and discharging a PIN diode to place the PIN diode in an OFF state and an ON state, respectively; recovering stored energy when the PIN diode is discharged; and holding a voltage across a series combination of the PIN diode and a RF blocking device when the PIN diode is in the OFF state, where the RF blocking device primarily passes DC current and primarily attenuates RF power.

In some aspects, the techniques described herein relate to a non-transitory, tangible processor-readable storage medium, wherein the method further includes boosting current after discharging the PIN diode.

In some aspects, the techniques described herein relate to a non-transitory, tangible processor-readable storage medium, wherein the method further includes holding the voltage across the series combination of the PIN diode and the RF blocking device using a higher voltage supply than a one performing the charging and discharging of the PIN diode.

In some aspects, the techniques described herein relate to a non-transitory, tangible processor-readable storage medium, wherein the method further includes recovering the stored energy through a holding supply configured to perform the holding the voltage across the series combination of the PIN diode and the RF blocking device.

In some aspects, the techniques described herein relate to a non-transitory, tangible processor-readable storage medium, wherein the method further includes, during the ON state of the PIN diode, providing a first current to the PIN diode via a resonant circuit to transition the PIN diode to the OFF state, and then holding the voltage across the PIN diode to maintain a reverse bias voltage on the PIN diode.

In some aspects, the techniques described herein relate to a non-transitory, tangible processor-readable storage medium, wherein the method further includes, during the OFF state of the PIN diode, drawing a second current from the PIN diode via the resonant circuit to transition the PIN diode to the ON state, and then holding the second current from the PIN diode to maintain a forward bias on the PIN diode.

Other embodiments of the disclosure can be characterized as a variable impedance matching network comprising a variable reactance element comprising a PIN diode coupled with a capacitor.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 2A illustrates a PIN diode equivalent circuit for FIG. 1A.

FIG. 2B illustrates another PIN diode equivalent circuit for FIG. 1B

DETAILED DESCRIPTION

Prior to describing the embodiments in detail, it is expedient to define terms as used in this document.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the functionality and operation of possible implementations of a two-stage, or two-stage in combination with a one or more low voltage reverse bias supplies, PIN diode driver according to various embodiments of the present disclosure. It should be noted that, in some alternative implementations, the functions noted in each block may occur out of the order noted in the figures. For example, two blocks shown in succession may, in fact, be executed substantially concurrently, or the blocks may sometimes be executed in the reverse order, depending upon the functionality involved. For instance, the operations of charging the PIN diode, holding a voltage across the PIN diode, and discharging the PIN diode can be reversed (e.g., discharging, holding, and then charging).

As noted earlier, a PIN diode is an electrical diode device with an un-doped or lightly doped intrinsic (I) semiconductor region sandwiched between a heavily doped p-type semiconductor region (P) and a heavily doped n-type semiconductor region (N); hence, the "PIN diode" designation. In general, PIN diodes obey conventional diode behavior for low frequency input signals, but operate as a resistor in the forward biased or on-state and as a small capacitor in the reverse biased or off-state for higher frequency input signals. As such, PIN diodes are often utilized in attenuators, fast switches, radio frequency (RF) applications, and high voltage electronic applications where high isolation and low loss are desired. In one particular implementation, PIN diodes are used in an impedance match network configured to match a changing load impedance of a plasma load to a desired impedance (e.g., 50 ohm or 70 ohm) so that a high-power RF generator can efficiently deliver power. In such an implementation, the PIN diodes serve to connect or disconnect reactive components, typically capacitors, of the impedance matching network to quickly alter the properties of the matching network by switching the reactive elements in and out of the network.

Figure 1B:
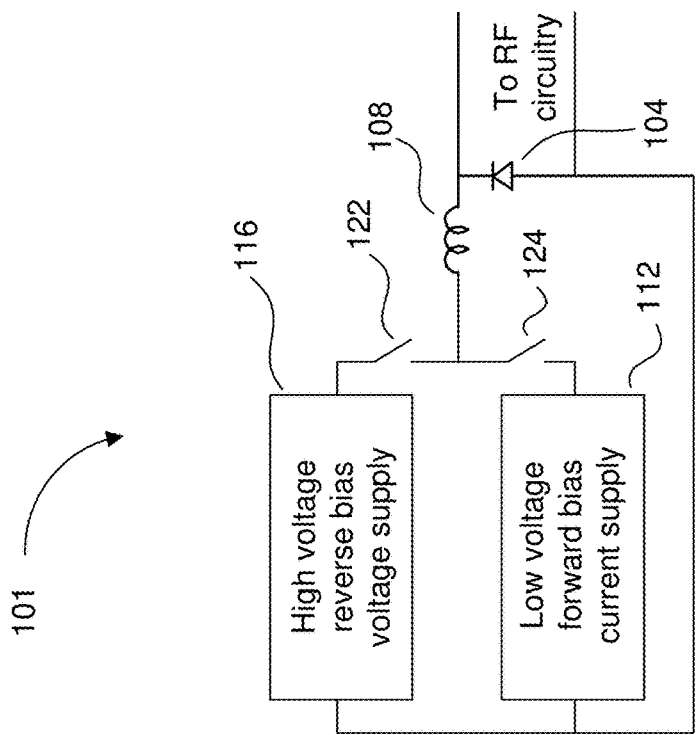
FIG. 1B illustrates another conventional dual supply PIN diode driver circuit.
Figure 1A:
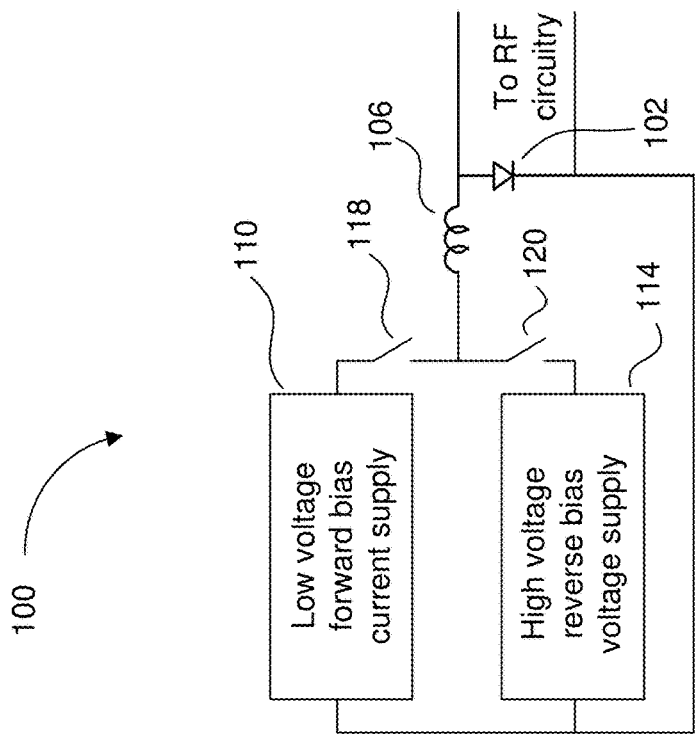
FIG. 1A illustrates a conventional dual supply PIN diode driver circuit.

PIN diodes in a switching circuit typically have an accompanying PIN diode driver circuit or switch driver that provides a controlled forward bias current and a reverse bias voltage. For example, FIGS. 1A and 1B illustrate two conventional dual supply PIN diode driver circuits, 100, 101. Each circuit includes a respective PIN-type diode 102, 104, which may in turn be connected to some type of RF circuitry, for example. Each PIN diode 102, 104 is driven by two power supplies (supplies 110 and 114 for circuit 100, and supplies 112 and 116 for circuit 101) to provide a forward bias current and a reverse bias voltage to the respective PIN diodes. For example, in the circuit 100, the low voltage forward bias current supply 110 is serially connected to a switch 118 and the high voltage reverse bias voltage supply 114 is also connected to a switch 120. When the switch 118 is closed (and switch 120 is open), the forward bias current supply 110 provides a forward bias current to the PIN diode 102. When switch 120 is closed (and switch 118 is opened), the reverse bias voltage supply 114 provides a reverse bias voltage across the PIN diode 102. Similarly, in circuit 101, a high voltage reverse bias voltage supply 116 is serially connected to a switch 122 to provide a reverse bias voltage across the PIN diode 104 when switch 122 is closed and a low voltage forward bias current supply 112 provides a forward bias current to the PIN diode 104 when switch 124 is closed. The inductors 106, 108 in the circuits 100, 101 may be inductors, but are also meant more generally to symbolize any circuits that pass direct-current (DC) at low frequencies, but suppresses the RF frequency applied to the PIN diodes 102, 104 by the RF circuitry. Some non-limiting examples of the type of circuits that may be at position 106, 108 include an RF choke, a parallel resonant LC tank or tanks, a quarter wavelength (at RF frequency) transmission line, etc.

Operation of the PIN diode driver circuit is now described in greater detail, and again refers to circuit 100 as an example. To forward bias the PIN diode 102, switch 118 is closed and switch 120 is open. The low voltage current supply 110 provides a forward bias current to the PIN diode 102. When the PIN diode is forward biased, holes from the P region material and electrons from the N region material of the diode 102 are injected into the sandwiched I region material. As the charges in the diode 102 cannot recombine instantaneously, a net charge is stored in the I region that decays exponentially if not continuously replenished with a time constant known as the carrier lifetime. The diode thus acts as a resistor with an effective "on" resistance value at RF frequency. An equivalent forward biased circuit 202 is illustrated in FIG. 2A.

To reverse-bias the PIN diode 102, switch 118 is opened and switch 120 is closed to provide a reverse bias voltage to the PIN diode from the high voltage reverse bias voltage supply 114. During reverse-bias operation, the PIN diode 102 has an equivalent circuit (204 of FIG. 2B) of a large resistor shunted by a small capacitance. By varying aspects of the PIN diode 102, a variety of forward-bias resistance and reverse-bias capacitance may be achieved for specific application in various contexts.

The potential performance issue with conventional PIN diode driver circuits 100, 101 is that such PIN diode drivers may consume large amounts of power when used in high speed, high repetition rate and/or high-power applications. For purposes of illustration, when a PIN diode 102 is used in a high-power application with frequencies ranging from 3 to 30 MHz, the PIN diode 102 may be forward biased with 1 amp from the forward bias current supply 110 and reverse biased with 1500 V from the reverse bias voltage supply 114. The carrier lifetime for a typical diode in such an application may be about 12 µs. To quickly (e.g., in a time period shorter than the carrier lifetime) switch from the forward biased (on) state to the reverse biased (off) state, the charge to be removed from the diode 102 tends to be the product of the forward current and carrier lifetime. In the example referenced immediately above, a charge of 12 μC is to be removed to switch from the forward biased to reverse biased state. If this charge is removed by the high voltage power supply 114, the energy expended is the product of the power supply voltage and the charge, i.e., 1500 V×12 μC=18 mJ. If this operation is performed at a high repetition rate, the power required can be prohibitive for many types of applications. For example, if the operation of the PIN diode 102 is to be performed at a 10 kHz repetition rate, the power from the high voltage power supply 114 in this example is 18 mJ×10 kHz=180 W.

To reduce the power expended in removing charge from the I region, reactive circuit elements can be used to either reduce expended energy or recover stored energy. For instance, the inductors 106 and 108 in combination with how the switches 118 and 120 or 122 and 124 are operated can be used to reduce expended energy or recover stored energy. However, reactive circuit elements create a dangerous situation where the PIN diode snaps off when the charge is being extracted from the I region. This sudden turn-off or sudden reduction of the current through the PIN diode creates a high voltage across the PIN diode if driven through an inductor (e.g., 106 and 108) as is typical for energy recovery, and this can lead to PIN diode failure.

One solution to this high-power consumption and rapid turn-off and overvoltage of the PIN diode is implementation of a two-stage (or dual-stage) driver circuit comprising a resonant stage for energy recovery followed by a holding stage. Such a two-stage driver circuit simultaneously achieves: 1) fast switching; 2) energy recovery; and 3) avoidance of a dangerous voltage spike when the diode snaps off. Using a first (resonant) stage followed by a second (holding) stage provides the ability to drive PIN diodes at high speed without requiring excessive power because energy is recovered in the system. The holding stage serves both to limit the voltage when the diode snaps off, and to hold the high reverse voltage and supply the current in the ON state. In the process of limiting the voltage, energy is recovered to a high voltage supply, in the holding stage, that is connected to the hold circuitry. Since the recovered energy generally exceeds the energy input to the system via the high-voltage supply, the excess recovered energy can be passed back to the resonant stage, optionally via a power converter. This excess recovered energy can also be passed to other sources besides the resonant stage or dissipated as heat (though this is typically not desired).

The two-stage drivers disclosed herein may enable high-speed solid-state matches (SSMs) in which matching to different states in a multi-level (multi-state) system is possible (instead of matching either the highest power state or matching to some average impedance presented to the generator). Other possible applications of high-speed PIN diodes switches (enabled by two-stage drivers) may comprise switching signal paths, selecting between different adjustable matches, etc.

Figure 3:
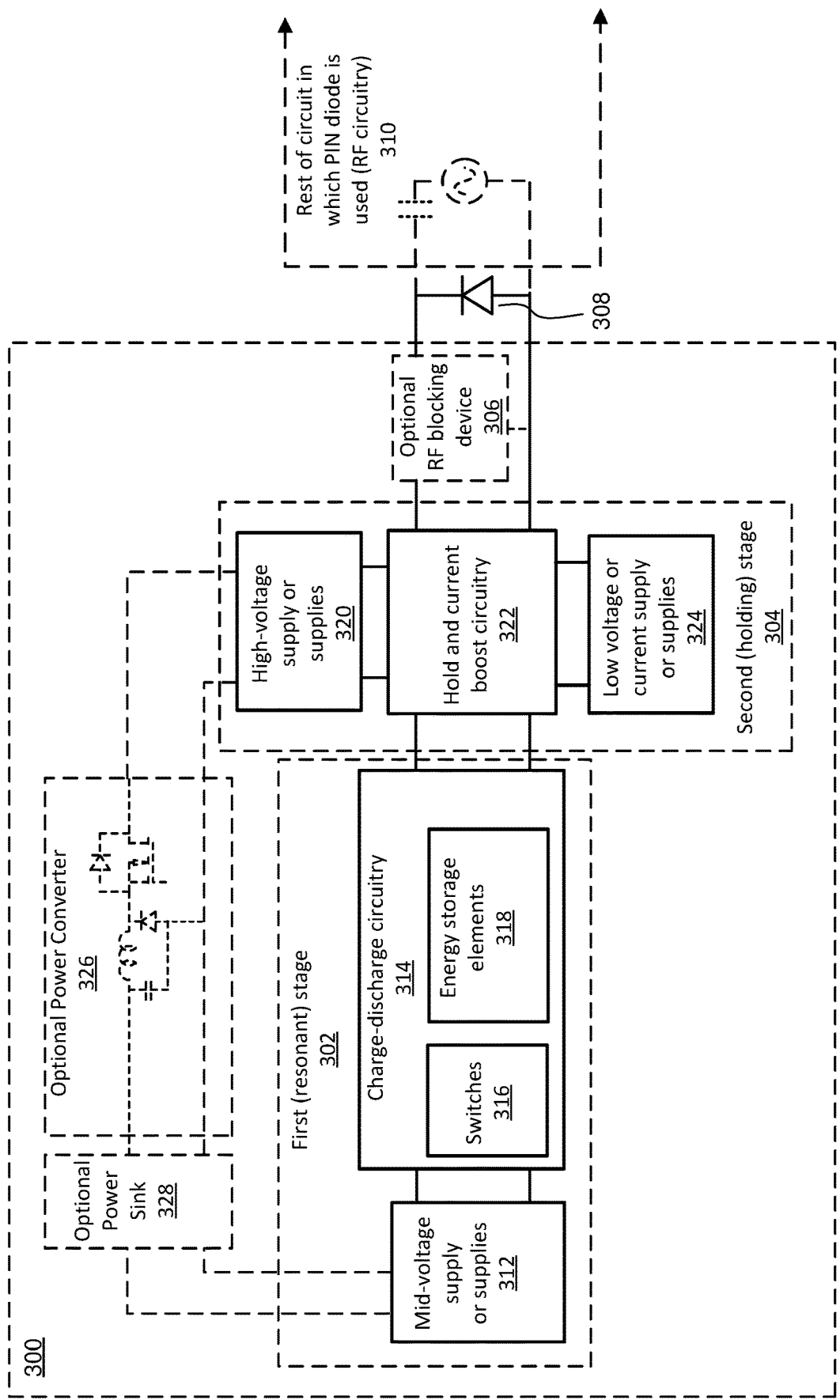
FIG. 3 is a block diagram illustrating an example of a two-stage PIN diode driver which may be used in implementing embodiments of the present disclosure.

Referring to FIG. 3, shown is a block diagram depicting an example of a two-stage driver presented in terms of functional components. As shown, the exemplary two-stage driver 300 comprises a resonant stage 302 and a holding stage 304 coupled to an optional RF blocking device 306, which in turn, is coupled to a PIN diode 308 coupled to a target circuit 310, such as the rest of an impedance match network comprising at least one capacitor, and wherein switching of the PIN diode 308 switches the capacitor in and out of the impedance matching network. The resonant stage 302 comprises a mid-voltage supply 312 as well as charge-discharge circuitry 314 comprising switches 316 and energy storage elements 318. In most cases only a single mid-voltage supply is used, but it is possible to use more than one mid-voltage supply. One may for example use a mid-voltage supply of 100 V to swing the cathode of PIN diode 308 between roughly −0.7 V and roughly 200 V and use a mid-voltage supply of 850 V to swing the cathode of PIN diode 308 between 200 V and 1500 V. It is the action of the resonant energy storage elements 318 that allows voltage swings of roughly double the voltage of the mid-voltage supplies. The holding stage 304 comprises a high-voltage supply or supplies 320, a low voltage or current supply or supplies 324 and hold and current boost circuitry 322. Some of the additional supplies making up the high voltage supply or supplies 320 may be much lower in voltage than the high voltage holding supply (e.g., 10 V or 50 V compared to 1500 V), but they are lumped in with the high-voltage supply because of how they may be used as illustrated in FIG. 6A-6E. An optional power converter 326 may be coupled between the high-voltage supply 320 and the mid-voltage supply 312 to move energy recovered by the holding stage 304 to the mid-voltage supply 312. The grouping of the circuitry comprising the two-stage driver 300 is to assist in explaining the operation of the circuitry and may not reflect the physical arrangement of the various circuit components. For example, multiple two-stage drivers may be connected to a single mid-voltage supply, a single high-voltage supply, and share the low-voltage supplies (optionally current supplies) and a single optional power converter may be connected between the shared high-voltage and shared mid-voltage supplies. Alternatively, a variable output supply could replace multiple low-voltage supplies in the holding stage 304.

In this embodiment, the rest of the circuit 310 in which the PIN diode 308 is used (RF circuitry) and an optional RF blocking device 306 depict aspects that may be implemented in connection with a solid-state match. Although other applications of the two-stage drivers are certainly contemplated, for purposes of providing a complete example, the present disclosure describes embodiments in the context of solid-state matches. Other applications of the two-stage driver include situations where a capacitor needs to be repeatedly charged and discharged such as driving the gate of a MOSFET.

In the present embodiment, the mid-voltage supply 312 applies power to enable the charge-discharge circuitry 314 to charge and discharge the PIN diode 308 (as well as any capacitive elements connected to the PIN diode 308) and thus cause the voltage across the PIN diode 308 to swing. By charging and discharging from the same voltage provided by the mid-voltage supply 312, energy supplied when charging is recovered when discharging. This energy recovery is a consequence of the fact that the energy supplied when charging is equal to the charge supplied by the mid-voltage supply 312 multiplied by the voltage of the mid-voltage supply 312 and when discharging the energy recovered is the charge recovered to the mid-voltage supply 312 multiplied by the voltage of the mid-voltage power supply. A charging voltage swing of more than double the voltage of the mid-voltage supply 312 may be achieved because of the time it takes for the PIN diode 308 to recover in which time additional energy is stored in the energy storage element(s) 318 (e.g., a resonant inductor such as L1 in FIG. 4). Depending on the design of the circuit 300, not all of the energy stored in the energy storage element(s) may be used to swing the voltage and the additional energy may be recovered to the high-voltage supply 320.

For example, and using the details shown in the embodiment of FIG. 4, which is one non-limiting implementation of the circuit in FIG. 3, during the charge cycle (toward reverse biasing of the PIN diode 408) of the circuit of FIG. 4, the cathode voltage of the PIN diode 408 is swung from roughly −0.7 V to roughly 1500 V. All voltages mentioned here are with respect to the node labeled REF in FIG. 4. Towards the end of the charge cycle the diode DS3 in the circuit of FIG. 4 will generally conduct and current will flow into the high voltage supply labeled Vhigh of the holding stage 404 in FIG. 4 resulting in energy being recovered to the high voltage supply. For this reason, the high voltage supply Vhigh can also be referred to as an energy recovery component. Once the PIN diode 408 cathode voltage is at 1500 V, or current stops flowing through the mid-voltage supply (Vmid) even if the PIN diode 408 cathode voltage is not at 1500 V, the switch S3 (that is part of the holding stage 404) may be closed to hold the PIN diode cathode voltage at 1500 V, i.e., hold the PIN diode 408 of FIG. 4 in the OFF state. Depending on the properties of the PIN diode 408 and the design of the driver, the cathode voltage of PIN diode 408 may not swing to 1500 V and no energy will be recovered to the high voltage supply. The case where energy is recovered to the high voltage holding supply is illustrated in FIG. 4G and the case where energy is not recovered to the high voltage supply is illustrated in FIG. 4H.

A discharging voltage swing of roughly double the difference in voltage between the high voltage supply and the mid-voltage supply is achieved during the discharge cycle (toward forward biasing). Since the voltage of the mid-voltage supply is generally less than half of the voltage of the high-voltage supply, this swing is generally sufficient to swing the cathode of the PIN diode 408 in the circuit of FIG. 4 from roughly 1500 V to roughly −0.7 V. During the discharge cycle some of the energy used in the charging cycle is recovered into the mid-voltage supply. Depending on the properties of the PIN diode and the design of the driver, the cathode voltage of PIN diode 408 may not swing to −0.7 V. The case where the cathode of PIN diode 408 swings below −0.7 V is illustrated in FIG. 4G and the case where the cathode of PIN diode 408 does not swing below −0.7 V is illustrated in FIG. 4H.

A small (often negligible) amount of energy may be recovered to one of the low voltage supplies in the holding stage towards the end of the discharge cycle. Once the discharge voltage swing is complete and the diode cathode voltage is at roughly a minimum forward bias voltage (e.g., −0.7 V), or current stops flowing through the mid-voltage supply even if the PIN diode 408 cathode voltage is not at a minimum forward bias voltage, switch S4 of FIG. 4 that is part of the holding stage may close to supply the PIN diode with forward current. More specifically, a forward bias current and a reverse bias voltage is provided to the PIN diode via closing of switch S4.

Figure 4A:
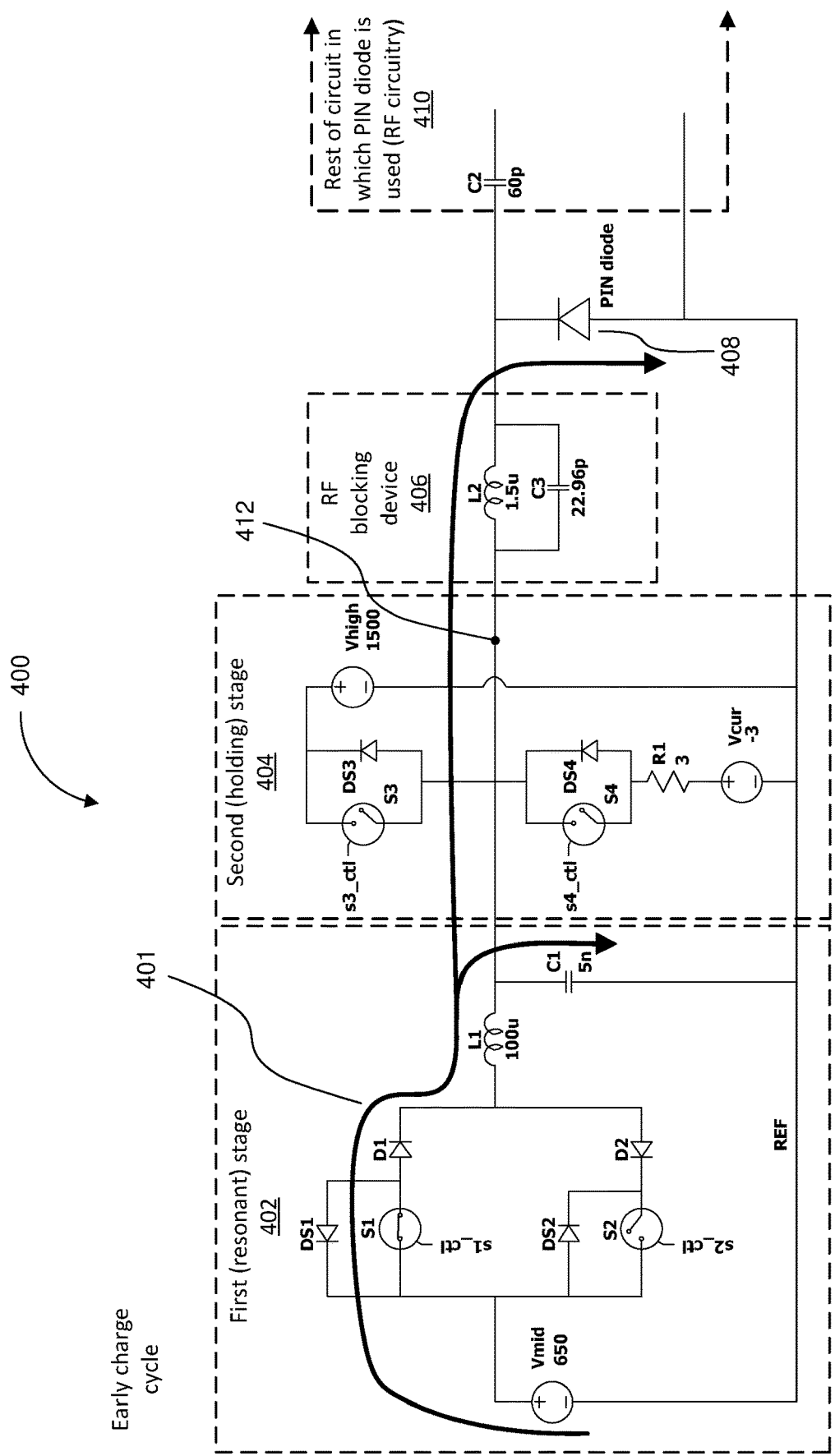
FIG. 4A illustrates early charge cycle operation of an example two-stage PIN diode driver circuit.
Figure 4B:
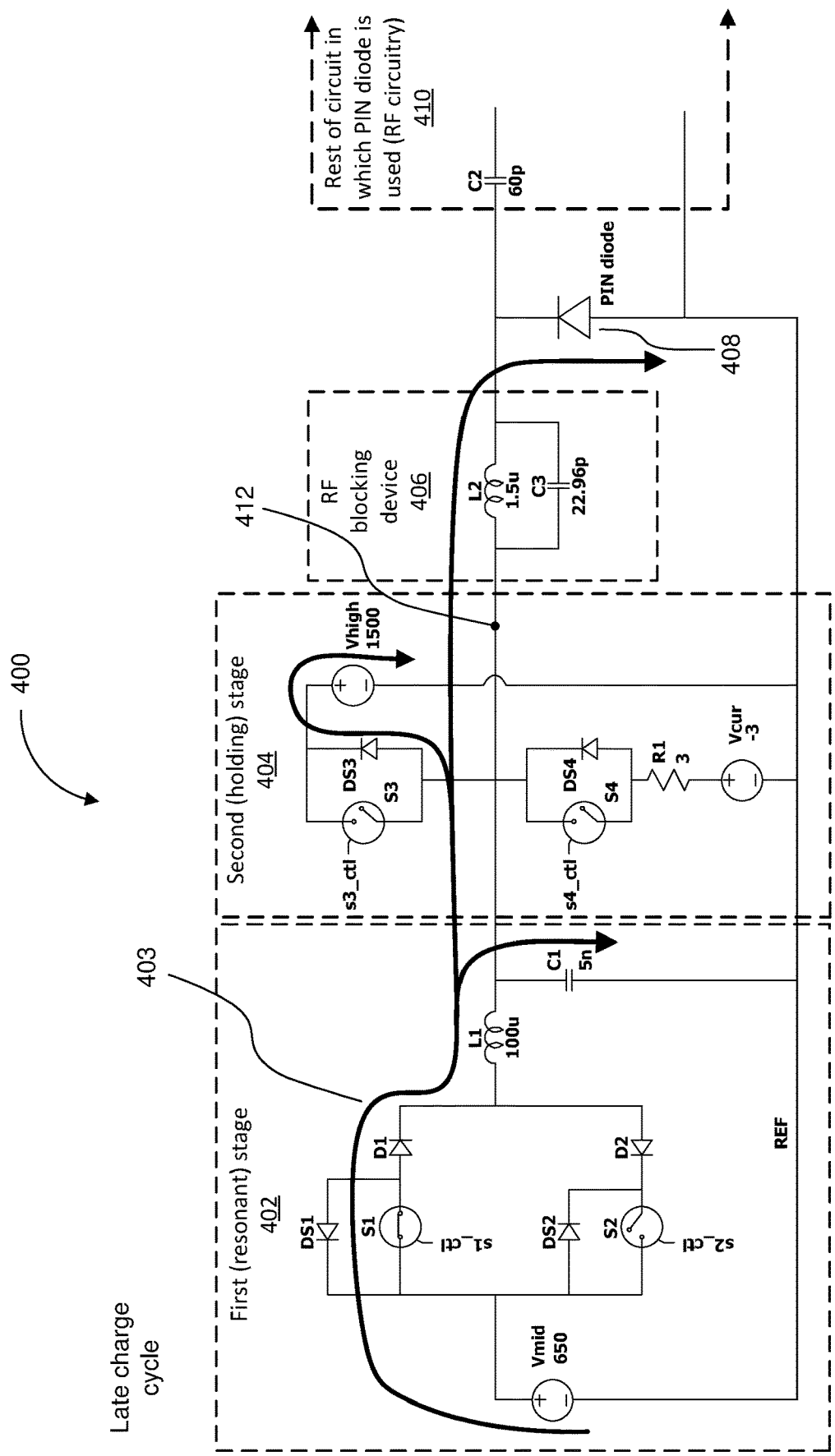
FIG. 4B illustrates late charge cycle operation of the example two-stage PIN diode driver circuit.
Figure 4C:
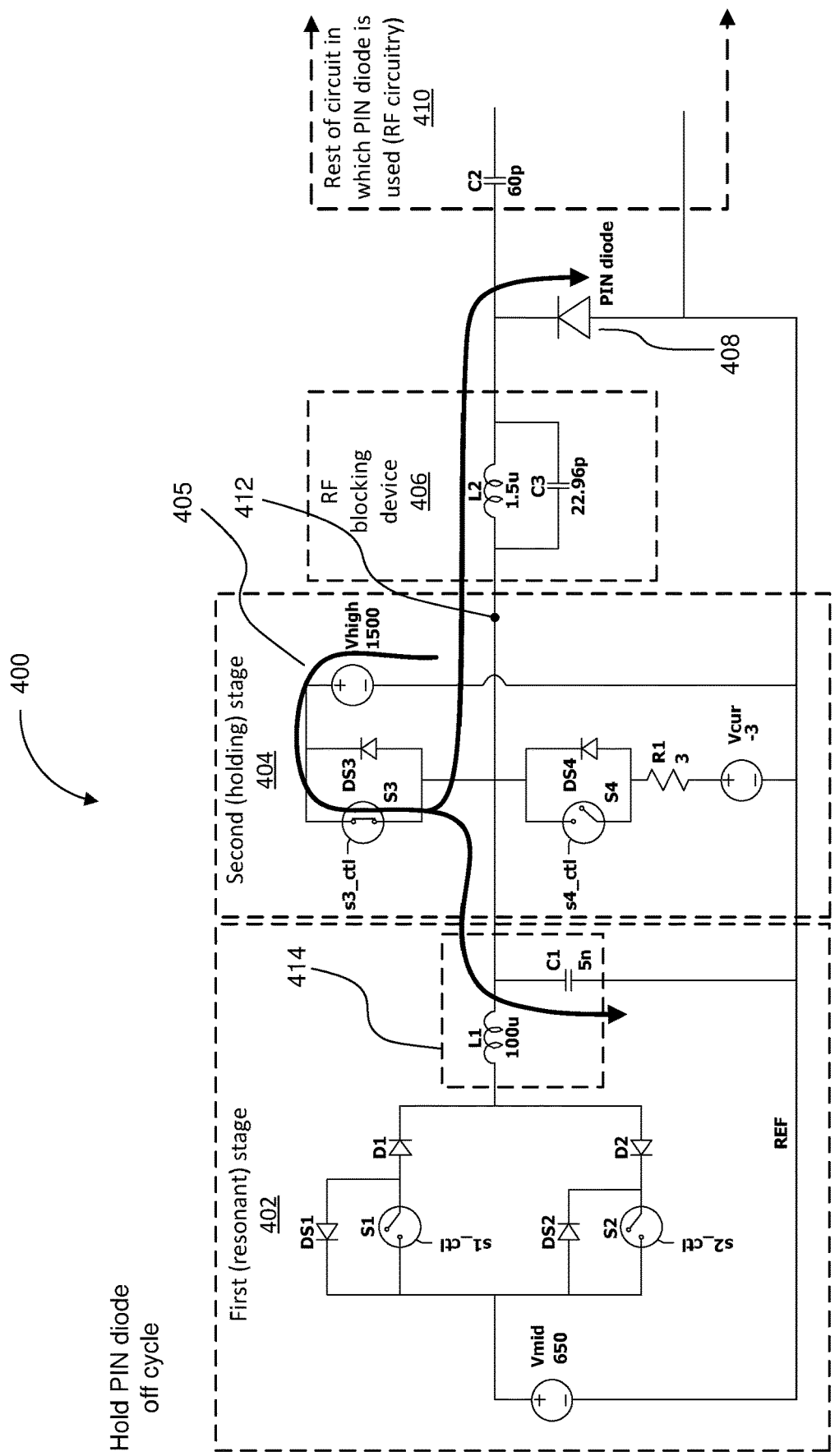
FIG. 4C illustrates a hold PIN cycle operation of the example two-stage PIN diode driver circuit.

FIG. 4A through FIG. 4F break the operation of the two-stage PIN diode driver 400 into cycles. The PIN diode 408 may stay an indeterminate amount of time in either the ON state labeled the "Hold PIN diode on cycle" in FIG. 4F or the OFF state labeled "Hold PIN diode off cycle" in FIG. 4C. To change the PIN diode from the ON to the OFF state, the cycles shown in FIG. 4A through 4C are executed. As shown in FIG. 4A, the process to change the PIN diode from the ON state to the OFF state (i.e., changing a voltage V at a controlled node 412 from V1 to V2) starts by opening S4 in FIG. 4A to disconnect the controlled node 412 from the forward bias current supply Vcur. After S4 is open, S1 is closed to connect the mid-voltage supply Vmid to the controlled node 412 through a resonant circuit 414 consisting of L1 and C1 in FIG. 4A. In some instances (not shown), C1 (part of the resonant circuit) may be on the PIN diode 408 side of the RF blocking device 406. The resonant circuit 414 causes current through the mid-voltage supply to increase from zero to a maximum value and back down to zero. If not for the diode D1, current through the mid-voltage supply may decrease below zero, but this is prevented by diode D1. The direction of current flow during this early charge cycle is indicated by 401 on FIG. 4A and also shown as the rising electrical potential and current at 422 in FIGS. 4G and 4H.

As shown in FIG. 4B, after some time the voltage of the controlled node 412 may rise to a level where DS3 in FIG. 4B conducts limiting the voltage of the controlled node 412 to no higher than a diode voltage drop above the voltage of the high voltage holding supply Vhigh in FIG. 4B. Current flow during this late charge cycle is labeled 403 in FIG. 4B and can also be seen in cycle 424 in FIG. 4G. Current flowing in the direction indicated by 403 results in energy being supplied to the high voltage holding supply Vhigh in FIG. 4B. For this reason, the high voltage supply Vhigh can also be referred to as an energy recovery component. Depending on the properties of the PIN diode 408 and design of the driver circuit the late charge cycle may or may not exist (note that cycle 424 does not exist in FIG. 4H). The voltage and current waveforms in the case where a late charge cycle 424 exists are shown in FIG. 4G. The case where a late charge cycle does not exist is shown in FIG. 4H. The duration of the early charge cycle together with the late charge cycle (if it exists) as depicted in FIGS. 4A, 4B and 4G or 4H depends on the properties of the PIN diode as well as the design of the driver but is typically on the order of a few microseconds, e.g., 2 microseconds.

After current stops flowing through the mid-voltage supply (first due to D1 blocking the flow of reverse current through the mid-voltage supply Vmid) switch S1 is opened as shown in FIG. 4C. After switch S1 is opened, switch S3 is closed to hold the controlled node 412 at the voltage of the high voltage holding supply Vhigh in FIG. 4C (see cycle 426 in FIGS. 4G and 4H). The direction of the initial current flow when S3 is closed is labeled 405. This current is significant for a short time period after S3 is closed. The PIN diode 408 is in the OFF (reverse biased) state and this cycle is labeled the hold PIN diode off cycle on FIG. 4C and the PIN diode 408 can stay in this state for an indeterminate amount of time.

Figure 4D:
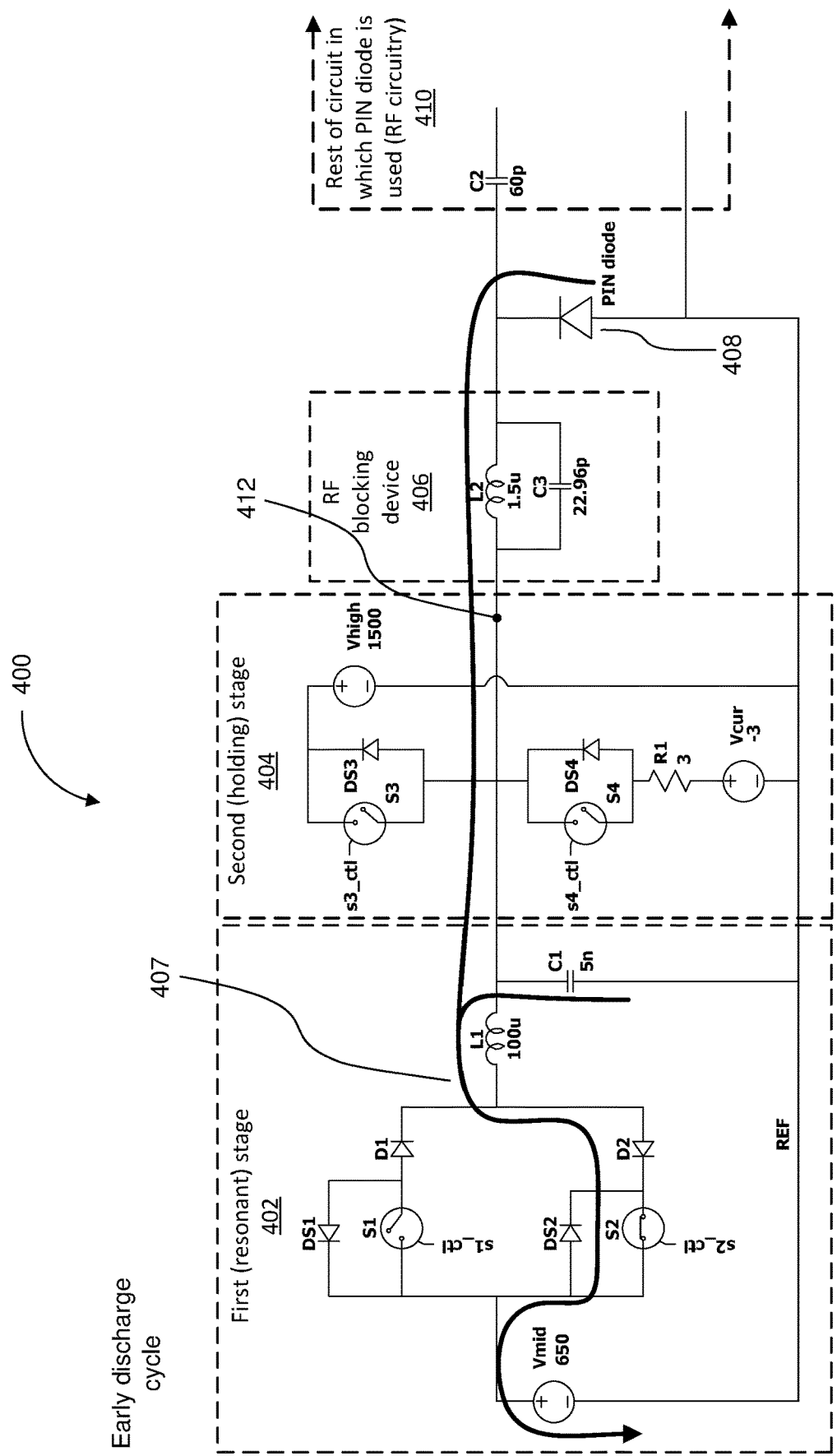
FIG. 4D illustrates early discharge cycle operation of the example two-stage PIN diode driver circuit.
Figure 4E:
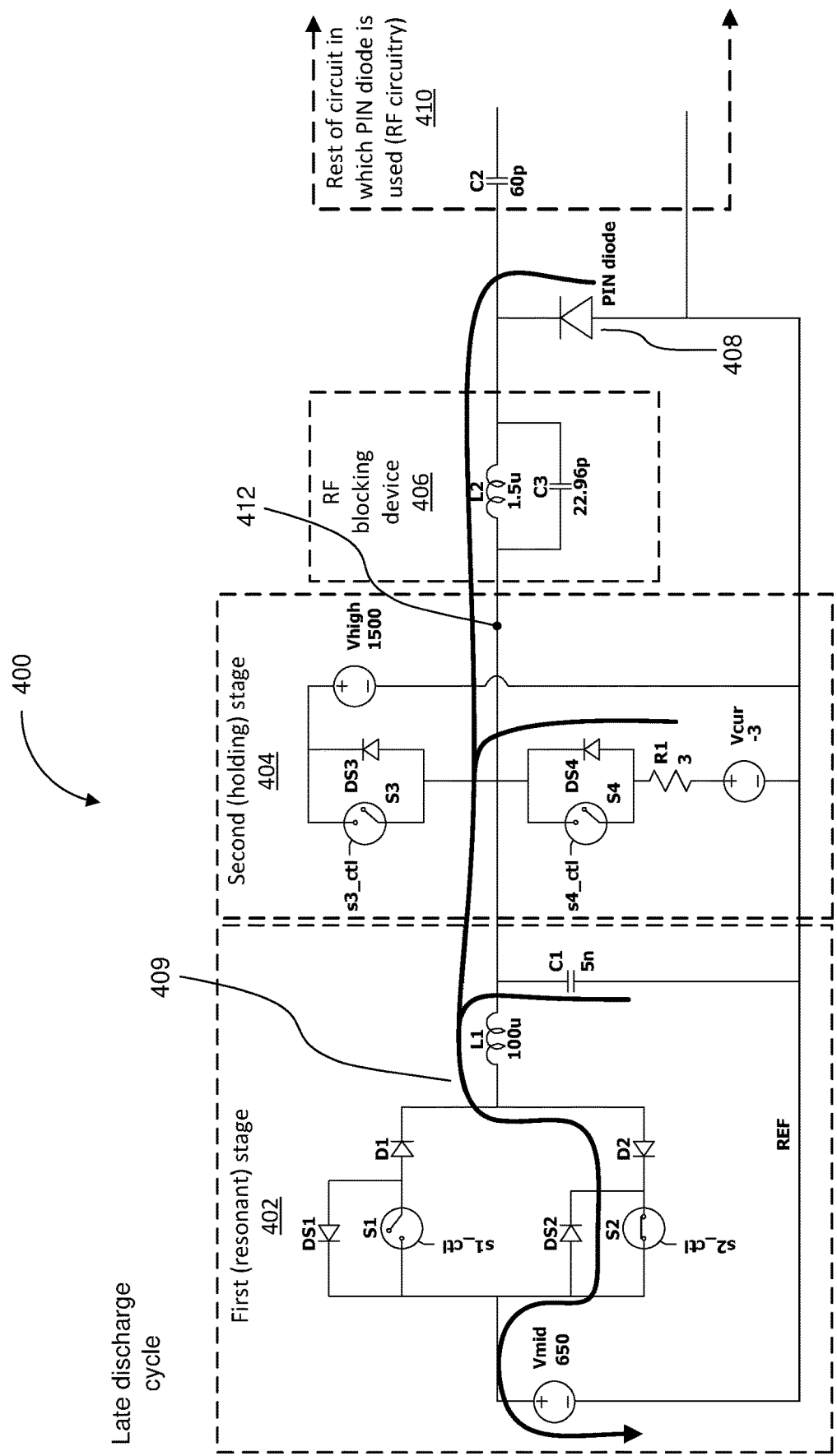
FIG. 4E illustrates late discharge cycle operation of the example two-stage PIN diode driver circuit.
Figure 4F:
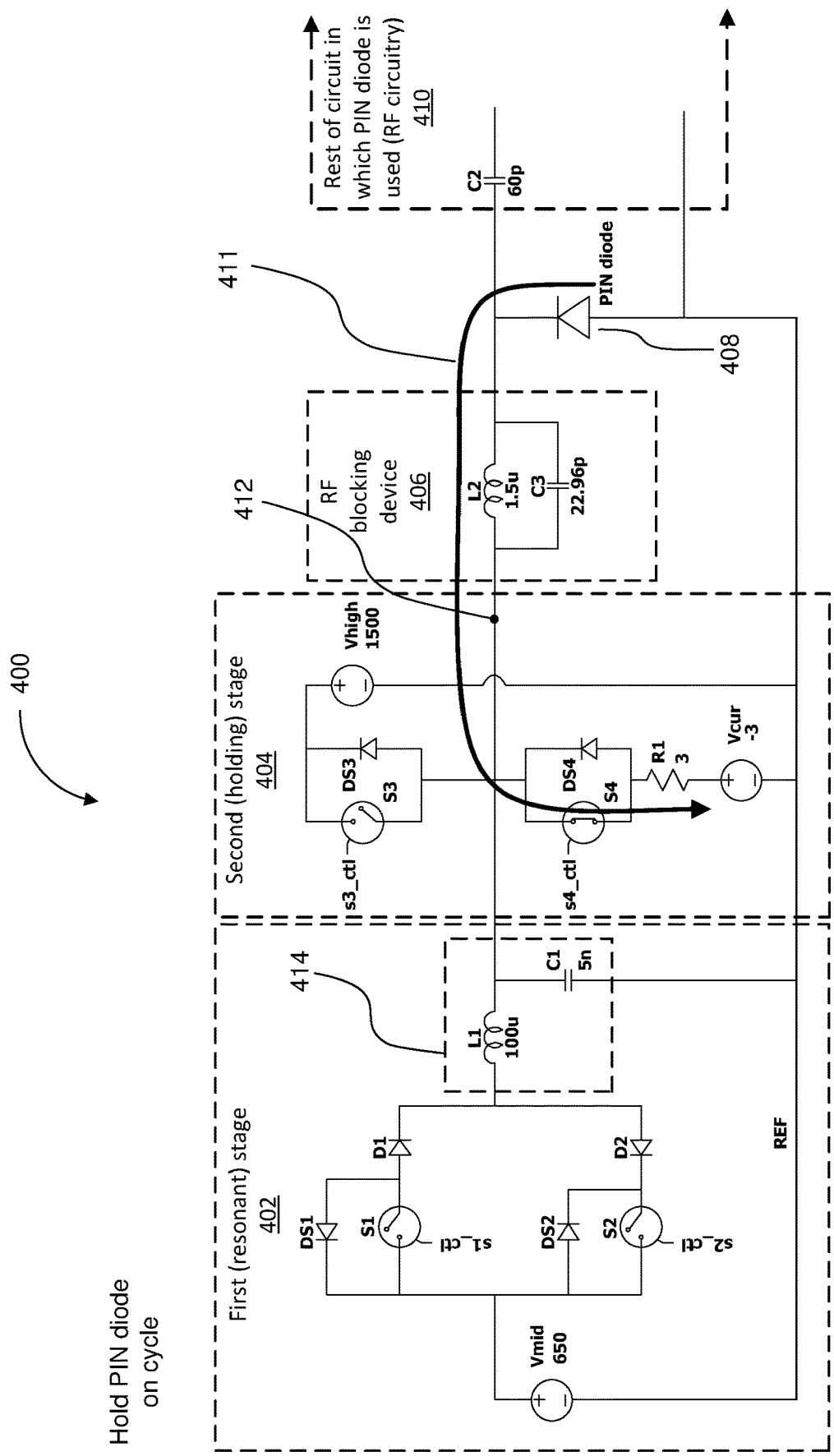
FIG. 4F illustrates a hold PIN cycle operation of the example two-stage PIN diode driver circuit.
Figure 4G:
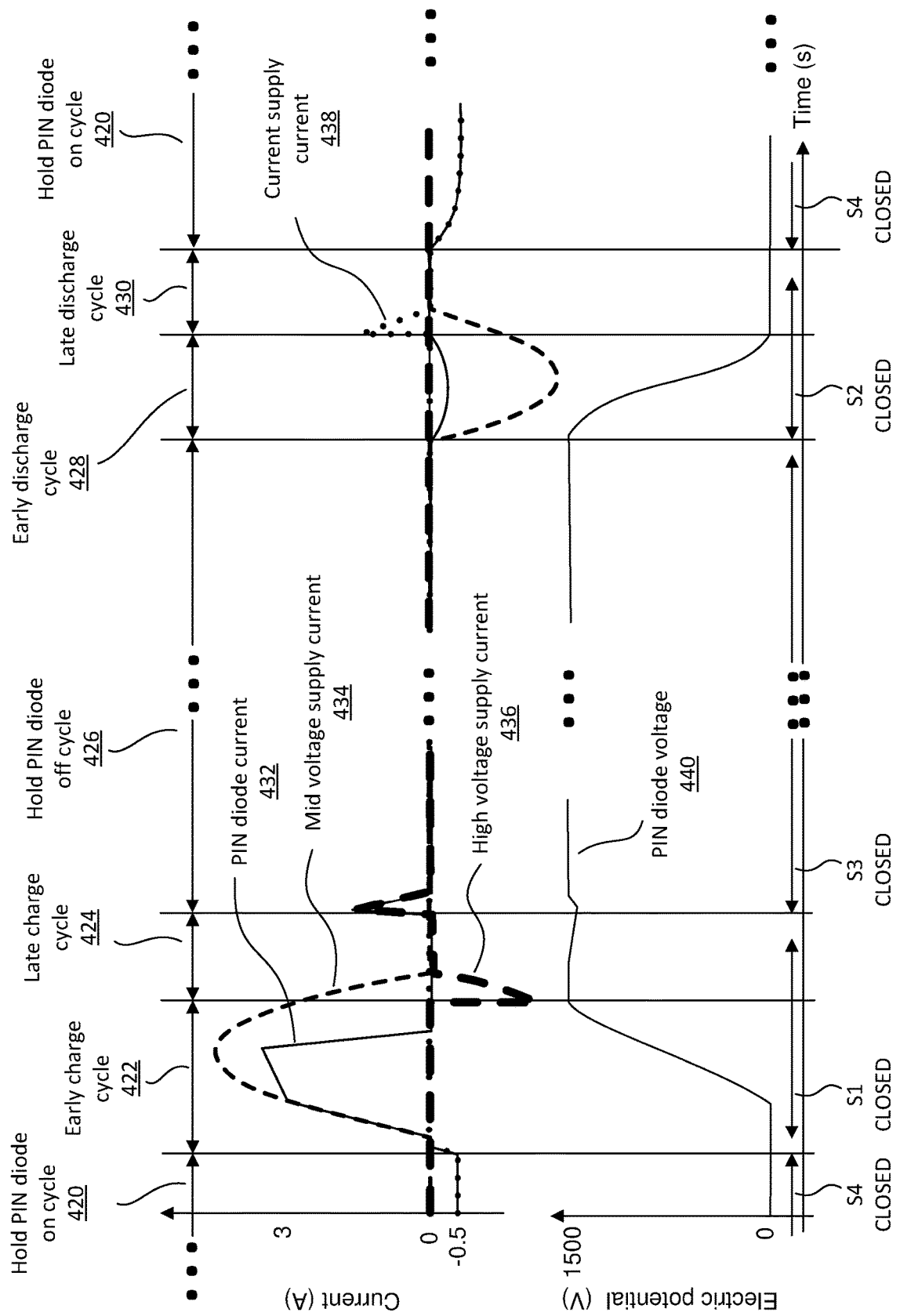
FIG. 4G illustrates current and voltage waveforms corresponding to an example two-stage PIN diode driver circuit under ideal conditions.
Figure 4H:
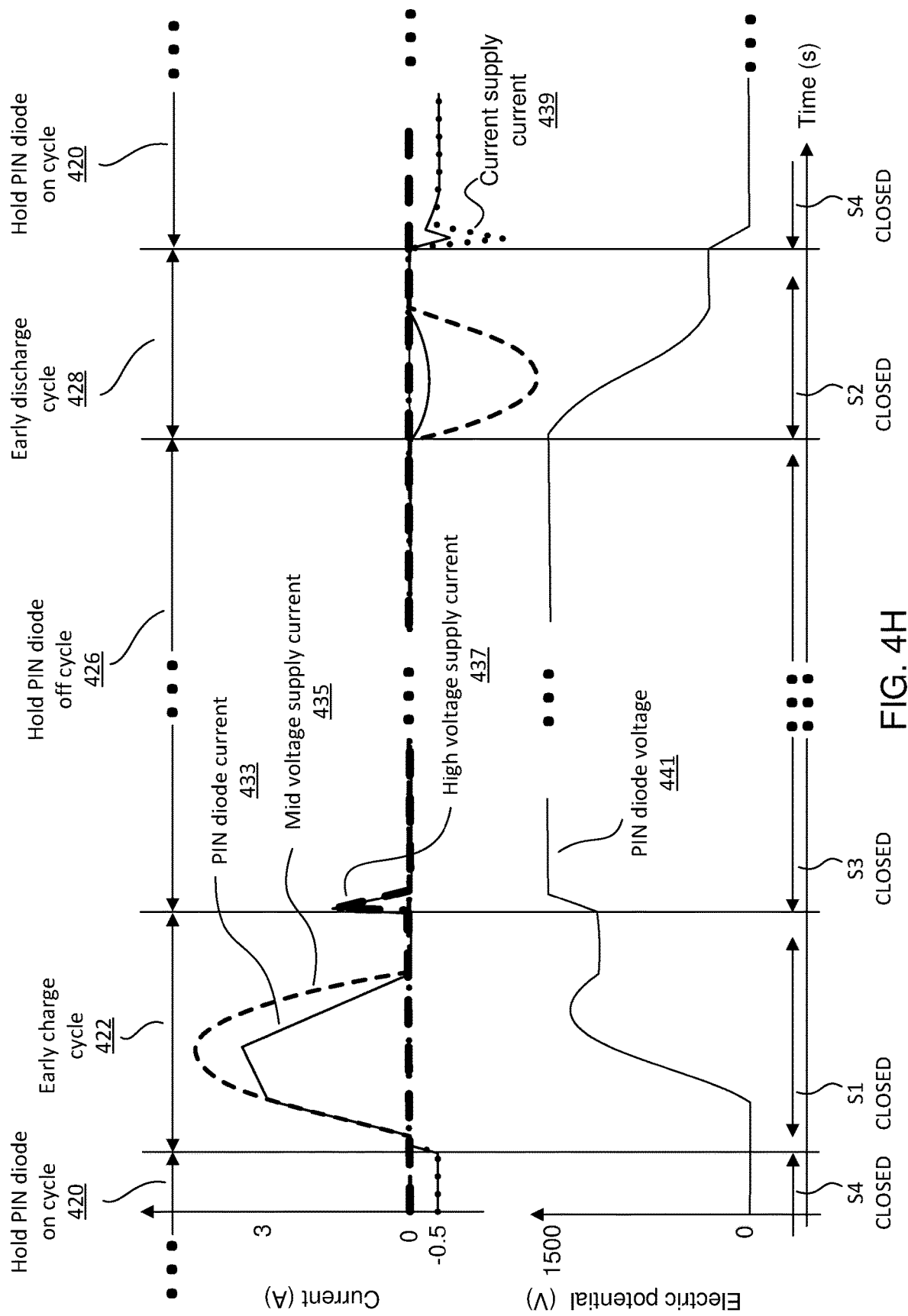
FIG. 4H illustrates current and voltage waveforms corresponding to an example two-stage PIN diode driver circuit under less-than-ideal conditions.

To change the PIN diode 408 from the OFF to the ON state, the cycles shown in FIG. 4D through 4F are executed (i.e., changing the voltage V at the controlled node 412 from V2 to V1). As shown in FIG. 4D, the process to change the PIN diode 408 from the OFF state to the ON state starts by opening switch S3 in FIG. 4D to disconnect the controlled node 412 from the high voltage holding supply Vhigh. After switch S3 is open, switch S2 is closed to connect the mid-voltage supply Vmid to the controlled node 412 though the resonant circuit (L1 and C1 in FIG. 4D). The direction of current flow after closure of S2 is labeled 407. Note that this direction of current flow means that energy is recovered to the mid-voltage power supply Vmid in FIG. 4D, and also shown as the falling electrical potential and current at 428 in FIGS. 4G and 4H. The recovered energy is from energy stored in the capacitors of the resonant circuit (C1 in FIG. 4D) as well as in the PIN diode 408 as well as in capacitors that may be connected to the PIN diode 408 e.g., the capacitor labeled C2 in FIG. 4D.

Due to the resonant circuit 414 the voltage of the controlled node 412 may drop below the voltage of the current power supply Vcur causing current to flow through the diode DS4. This late discharge cycle depicted in FIG. 4E may or may not exist depending on the properties of the PIN diode and the design of the driver circuit. In the case where the late discharge cycle exists, the voltage and current waveforms are shown in FIG. 4G. In the case where the late discharge cycle does not exist, the voltage and current waveforms are shown in FIG. 4H. The combined duration of the early and late discharge cycles depends on the properties of the PIN diode and the design of the driver, but is generally on the order of a few microseconds, e.g., 2 microseconds. The current through the mid-voltage supply will first increase in the direction shown 409 to a maximum value before it will start decreasing again. If not for diode D2 the current through the mid-voltage supply may reverse direction, but this is prevented by diode D2.

After current stops flowing through the mid-voltage supply (first due to D2 blocking the flow of reverse current) switch S2 is opened as shown in FIG. 4F. After switch S2 is opened, switch S4 is closed to connect the controlled node 412 to the current supply (Vcur in FIG. 4F, the second holding power supply). The current supply Vcur supplies current through the PIN diode 408 to keep the PIN diode 408 in the ON state. The PIN diode 408 is now in the ON (forward biased) state, and this cycle is labeled the hold PIN diode 408 on cycle on FIG. 4F and the PIN diode 408 can stay in this state for an indeterminate amount of time.

Figure 5:
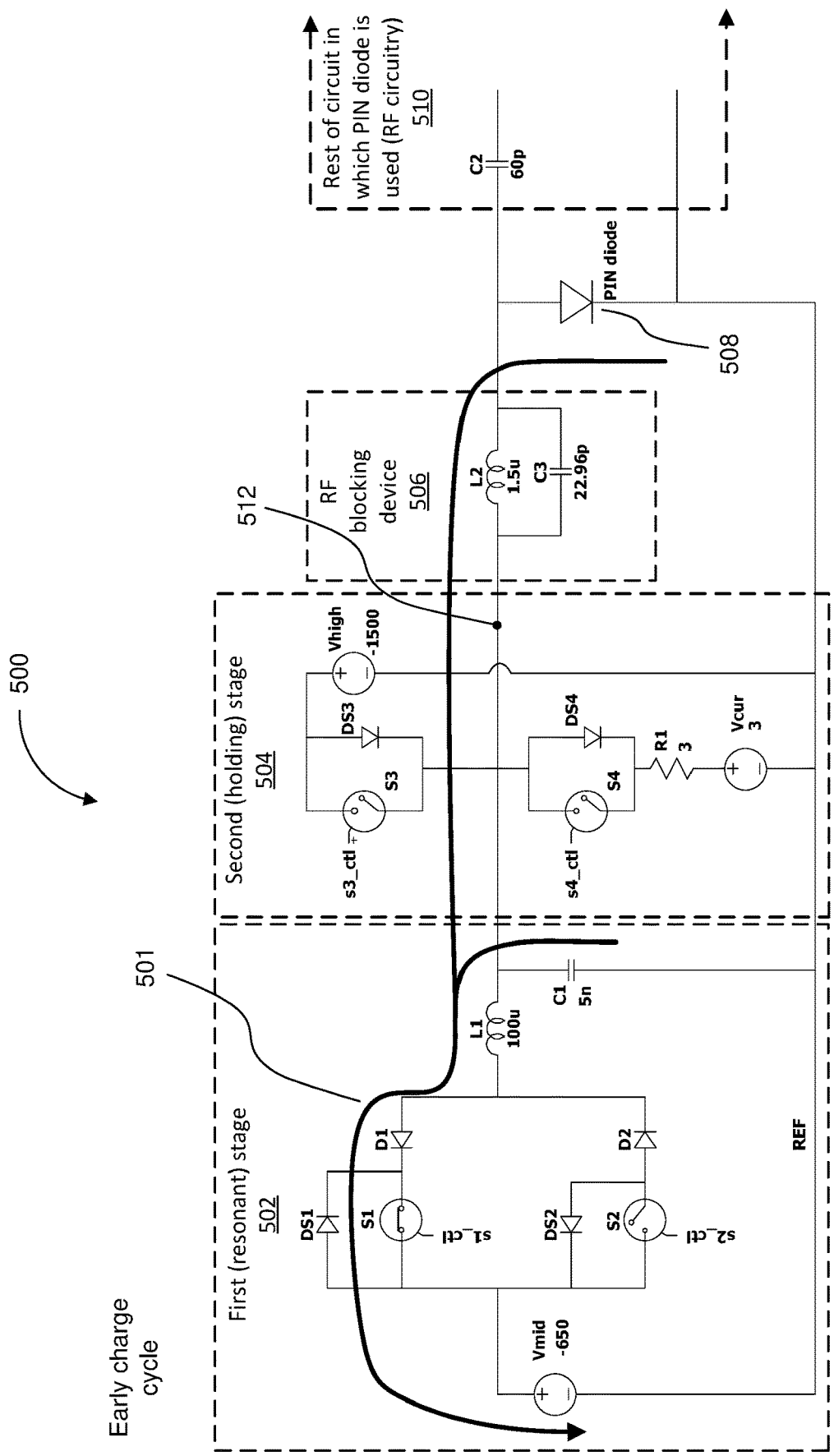
FIG. 5 illustrates another example two-stage PIN diode driver circuit.

FIG. 5 shows a two-stage PIN diode driver connected to a PIN diode 508. In this example circuit the cathode of the PIN diode 508 is connected to the reference node labeled REF in FIG. 5 and the controlled node 512 is connected to the anode of the PIN diode 508. The operation of this circuit can be obtained from the operation of the circuit of FIG. 4 by reversing all diodes, reversing the polarities of all voltages and reversing the direction of the currents compared to that of FIG. 4, otherwise the operation is identical.

Figure 6A:
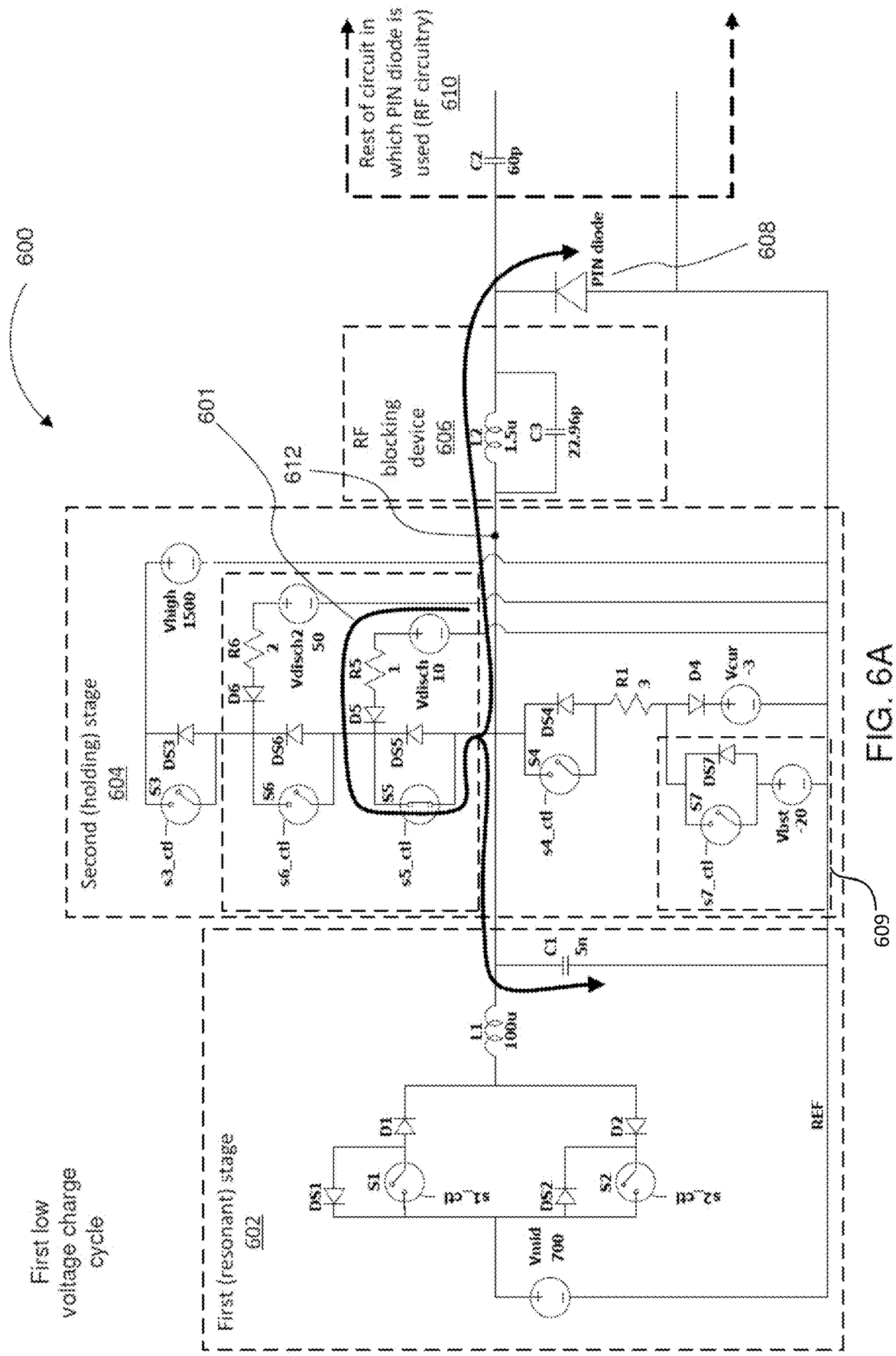
FIG. 6A illustrates first low voltage charge cycle operation of an example two-stage PIN diode driver circuit combining the two-stage circuit with two low-voltage reverse bias power supplies as well as a current boost circuit.

FIG. 6A shows a two-stage PIN diode driver further incorporating two low-voltage reverse bias power supplies as well as current boost circuitry. The addition of the two low-level reverse bias power supplies further reduces energy consumption of the two-stage PIN diode driver. The addition of current boost circuitry 609 (e.g., Vbst, S7, and DS7) improves RF switching performance by increasing the current above nominal levels for a short period of time when transitioning the PIN diode 608 to the ON state to more quickly increase electron and hole concentrations in the intrinsic region of the PIN diode 608 in order to reduce diode ON state resistance and thus RF losses, if RF is applied through the RF circuitry 610, more quickly.

Referring back to FIGS. 4G and 4H, notice that in the early charge cycle 422, there is simultaneously voltage across 440 (FIG. 4G) or 441 (FIG. 4H) and current through the PIN diode 432 (FIG. 4G) or 433 (FIG. 4H). Certainly, in the early part of the early charge cycle 422 (and depending on the PIN diode properties more likely during the entire early charge cycle) the power represented by the product of this voltage and current is wasted power because the current is conduction current and not displacement current, i.e., energy is not stored in the PIN diode, but wasted as heat. By first charging the PIN diode from a lower voltage, charge can be cleared from the intrinsic region using less energy. More than one low voltage may be used to optimize energy loss and total switching time. As such, though FIGS. 6A-6E show two low voltage discharge supplies, one or more such low voltage supplies can be implemented, with each of two or more of these being of increasing voltage and sequentially switched into connection with the controlled node 612.

Figure 6B:
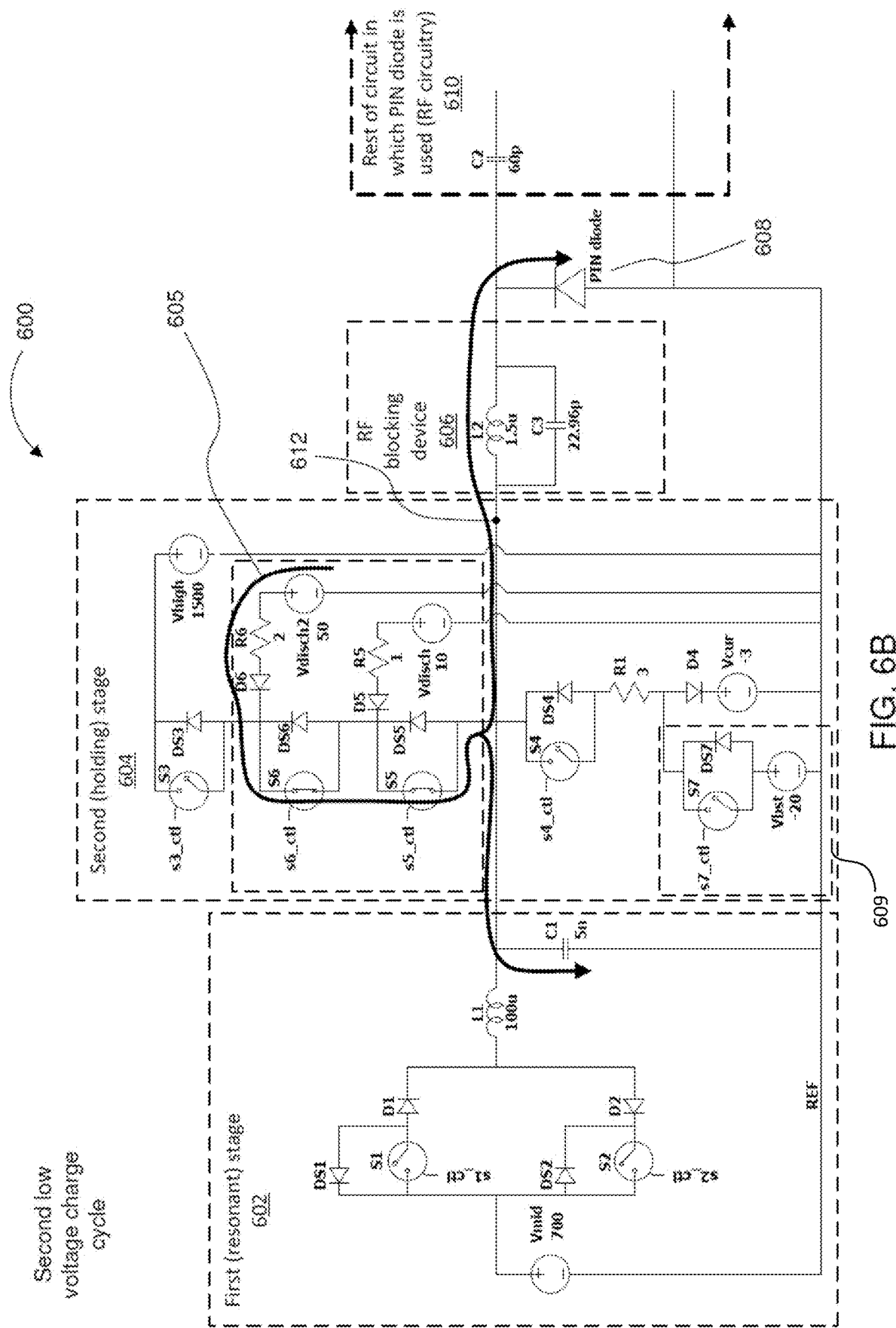
FIG. 6B illustrates second low voltage charge cycle operation of the example two-stage PIN diode driver circuit combining the two-stage circuit with two low-voltage reverse bias power supplies as well as a current boost circuit.

FIG. 6A shows a first low voltage charge cycle that is inserted between the hold PIN diode on cycle 420 in FIGS. 4G and 4H and the early charge cycle 422 in FIGS. 4G and 4H. As shown in FIG. 6A, after disconnecting the controlled node 612 from the current supply Vcur and before closing switch S1 to start the early charge cycle, the controlled node 612 is first connected to a first low voltage reverse bias power supply Vdisch by closing S5 in FIG. 6A (see also cycle 628 in FIG. 6D). After some time as shown in FIG. 6B, the controlled node 612 may be connected to a second low voltage reverse bias power supply Vdisch2 (see also cycle 630 in FIG. 6D). After some time removing charge from the PIN diode 608 using the second low voltage reverse bias power supply, switch S1 in FIG. 6B is closed to start the early charge cycle 622 in FIG. 6D. The resulting waveforms are shown in FIG. 6D. The total time to transition the PIN diode 608 from ON to OFF state (end of hold PIN diode on cycle 620 to start of hold PIN diode off cycle 626 in FIG. 6D) depends on the properties of the PIN diode and design of the driver but is generally on the order of a few microseconds, e.g., 5 microseconds.

Figure 6C:
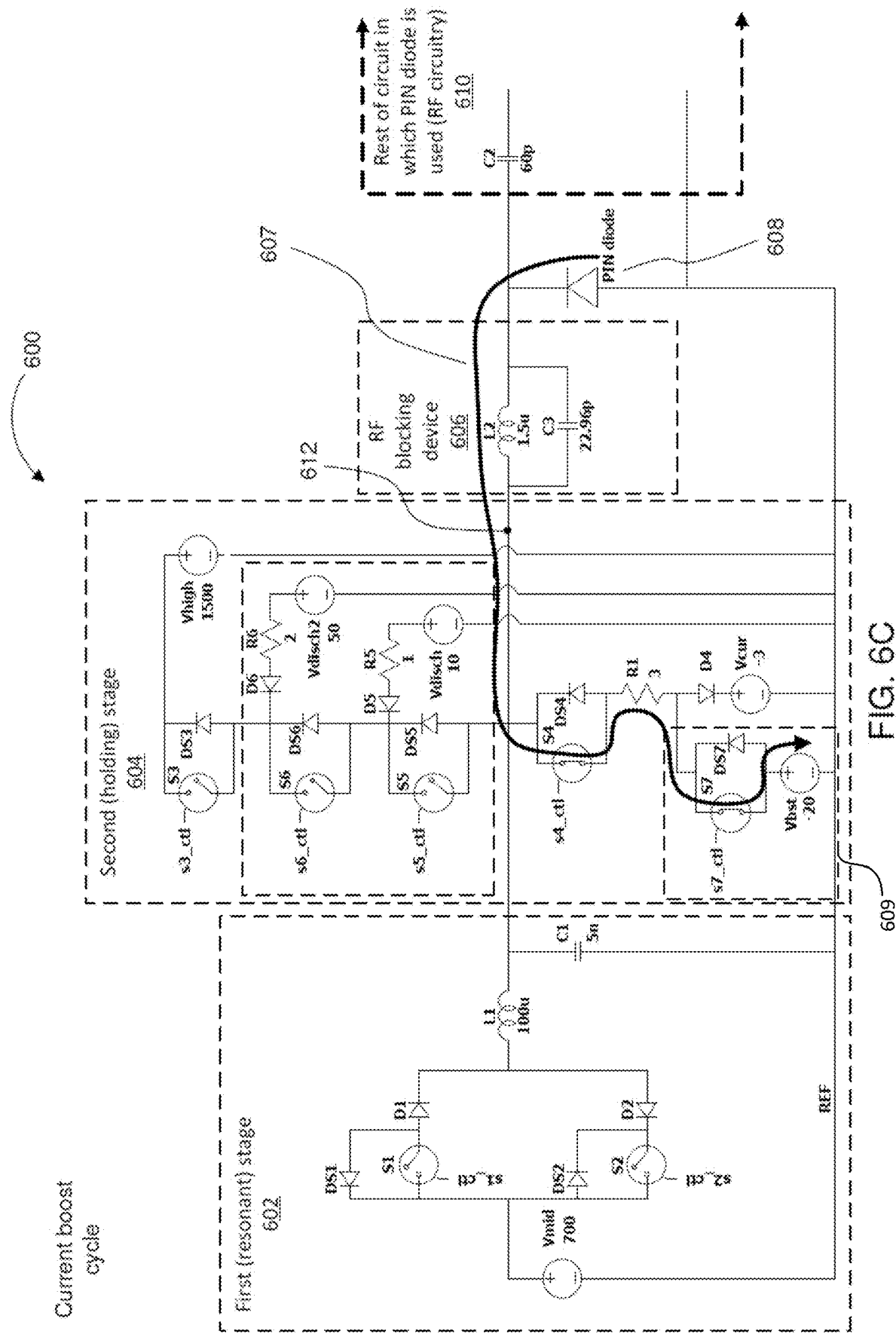
FIG. 6C illustrates a current boost cycle operation of the example two-stage PIN diode driver circuit combining the two-stage circuit with two low-voltage reverse bias power supplies as well as a current boost circuit.
Figure 6D:
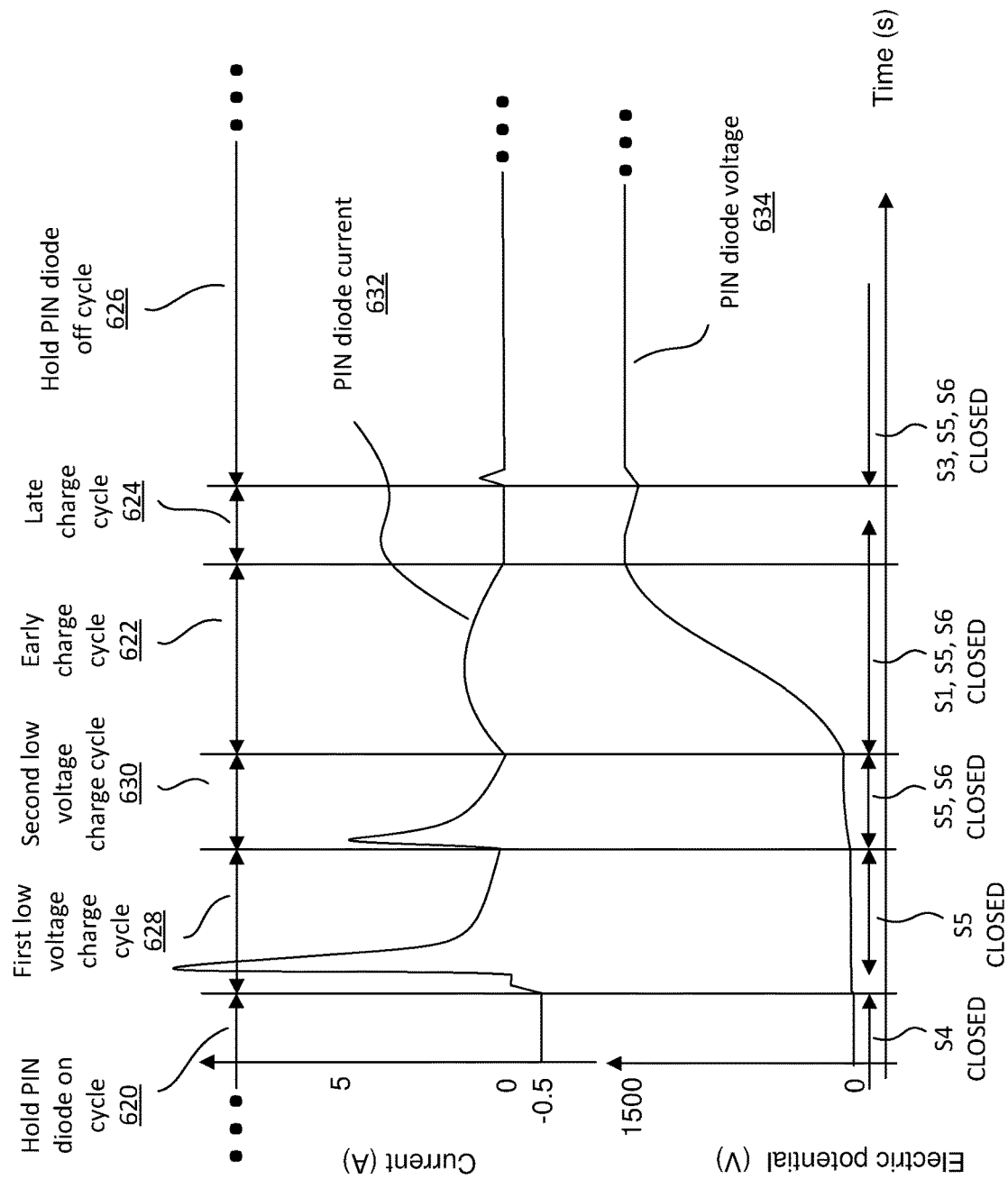
FIG. 6D illustrates the operation of an example two-stage PIN diode driver circuit combined with two low-voltage reverse bias power supplies as well as a current boost circuit.
Figure 6E:
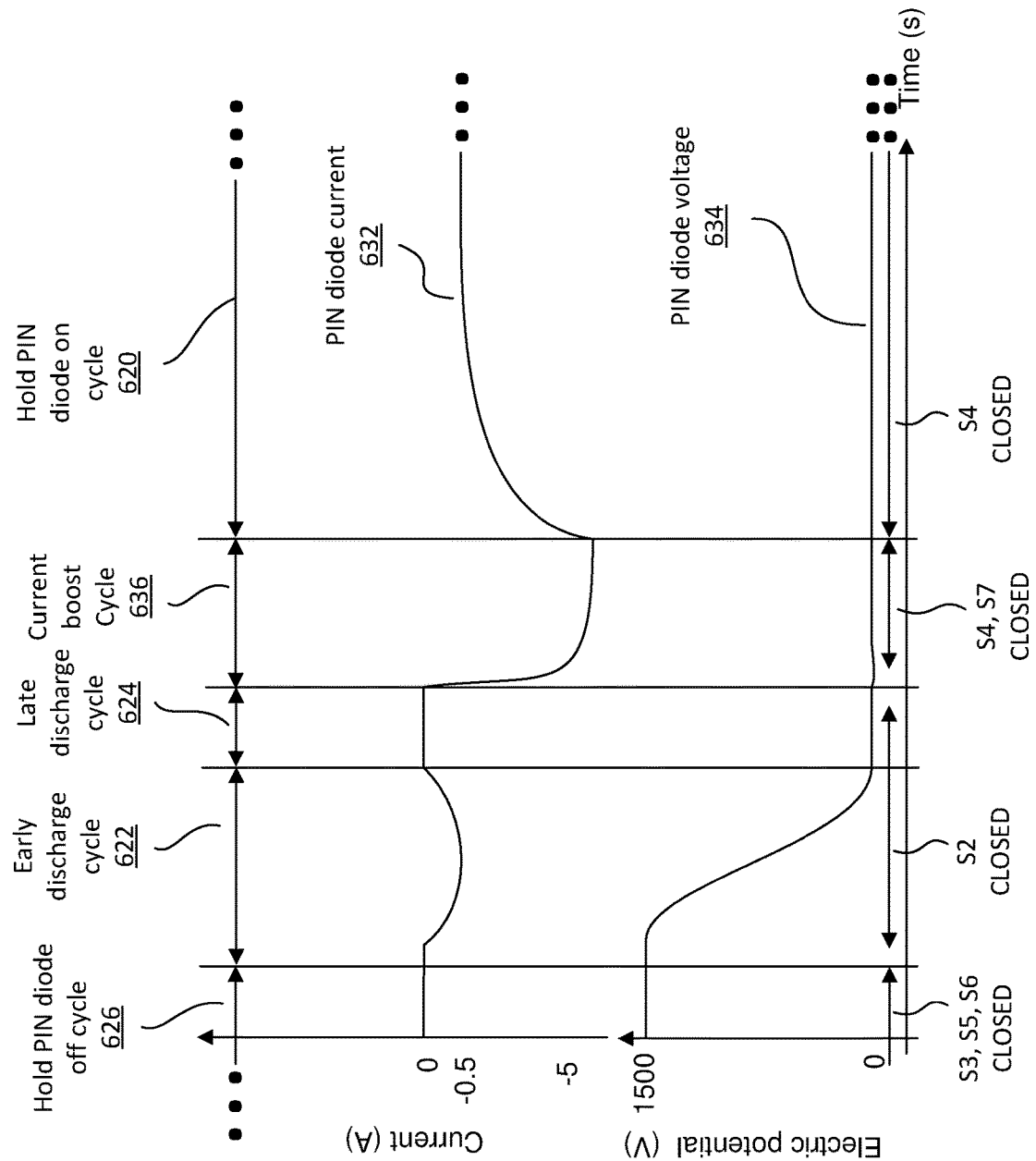
FIG. 6E illustrates another embodiment of operation of the example two-stage PIN diode driver circuit combined with two low-voltage reverse bias power supplies as well as a current boost circuit.

FIG. 6C shows the use of a current boost power supply Vbst in FIG. 6C together with other circuitry (including S7 and D4) to temporarily boost PIN diode forward current 607 when the PIN diode is first turned ON. As shown in FIG. 6E, after completion of the early and late (if it exists) discharge cycles 622, and 624, both switches S4 and S7 in FIG. 6C are closed to increase, or boost, forward current through the PIN diode for a short period of time. This increased forward current increases the concentration of electrons and holes in the PIN diode 608 intrinsic region more quickly thus reducing ON-resistance of the diode 608 more quickly and thus reducing losses due to RF current flowing through the PIN diode 608 as a result of the RF circuitry 610. After some time switch S7 in FIG. 6C is opened allowing the PIN diode 608 forward current to return to normal levels. This current boost can increase the PIN diode 608 forward current by a factor 2 to 100 and for a duration of 1 to 100 microsecond, depending on how the design is optimized for loss and power consumption. Although only two low voltage reverse bias power supplies Vdisch are shown in FIG. 6A-6E, those of skill in the art will appreciate that one or more than two can also be implemented without undue experimentation.

Figure 7:
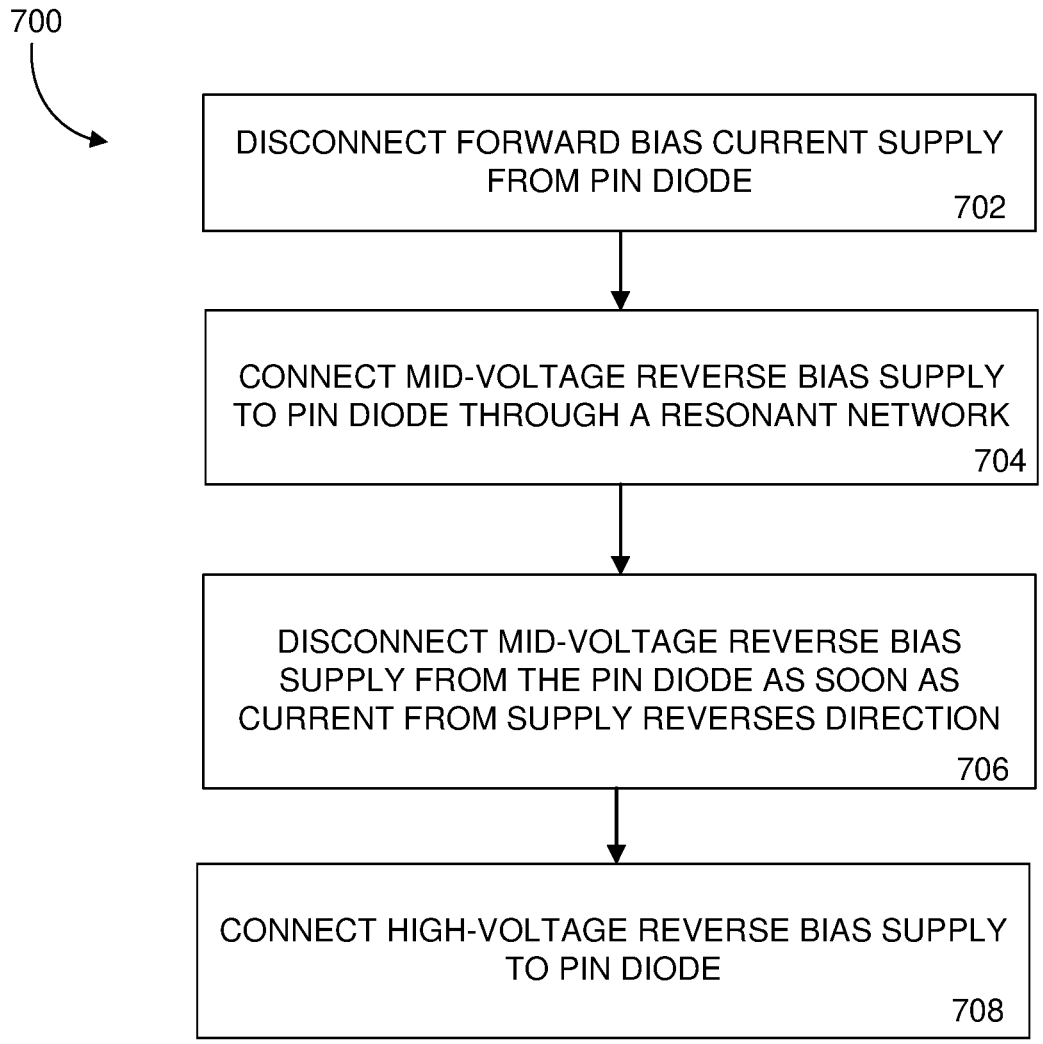
FIG. 7 is a method for controlling a two-stage PIN diode driver circuit when changing the PIN diode from a forward biased ON state to a reverse biased OFF state.

FIG. 7 shows a method 700 for controlling a two-stage PIN diode driver circuit when changing the PIN diode from a forward biased ON state to a reverse biased OFF state. The method starts with the diode in the forward biased ON state. First the PIN diode is disconnected from a forward bias current supply (operation 702). For instance, this could involve opening of S4 as seen when going from FIG. 4H to 4A. Next the PIN diode is connected to a mid-voltage reverse bias power supply through a resonant network (operation 704). One implementation of this operation is seen with the closing of S1 in FIG. 4A. This connection to the mid-voltage reverse bias power supply through a resonant circuit causes the current drawn from the mid-voltage reverse bias power supply to increase to a maximum value before decreasing again. If this connection is maintained, the current through the mid-voltage reverse bias power supply will change direction, but this is prevented by disconnecting the PIN diode from the mid-voltage reverse bias power supply as soon as the current reverses direction (operation 706). Operation 706 can be enabled by placing a diode (e.g., diode D1 in FIG. 4A) in series with the switch (e.g., switch S1 in FIG. 4A) connecting the PIN diode to the mid-voltage reverse bias power supply through a resonant network. For instance, S1 can be opened as seen in FIG. 4C. Finally, the PIN diode is connected to a high-voltage reverse bias power supply (operation 708) to hold the PIN diode in the reverse biased (OFF) state, such as seen with the closing of S3 in FIG. 4C.

Figure 8:
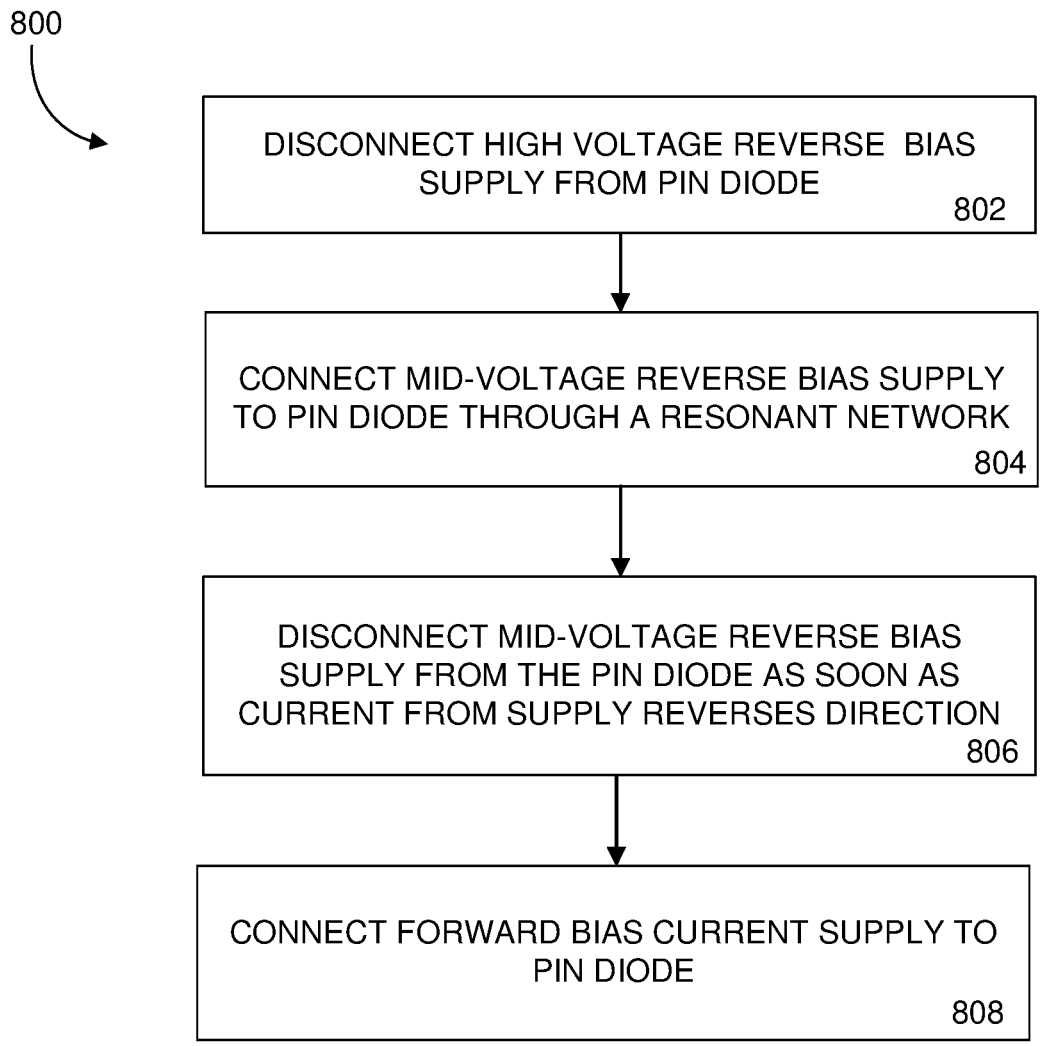
FIG. 8 is a method for controlling a two-stage PIN diode driver circuit when changing the PIN diode from a reverse biased OFF state to a forward biased ON state.

FIG. 8 shows a method 800 for controlling a two-stage PIN diode driver circuit when changing the PIN diode from a reverse biased OFF state to a forward biased ON state. The method starts with the diode in the reverse biased OFF state. First the PIN diode is disconnected from the high voltage reverse bias power supply (operation 802) (e.g., opening of S3 in FIG. 4D). Next the PIN diode is connected to a mid-voltage reverse bias power supply through a resonant network (operation 804) (e.g., closing of S2 in FIG. 4D). This connection to the mid-voltage reverse bias power supply through a resonant circuit causes the current drawn from the mid-voltage reverse bias power supply to increase to a maximum value before decreasing again. If this connection is maintained, the current through the mid-voltage reverse bias power supply will change direction, but this is prevented by disconnecting the PIN diode from the mid-voltage reverse bias power supply as soon as the current reverses direction (operation 806). Operation 806 can be enabled by placing a diode (e.g., diode D2 in FIG. 4A) in series with the switch (e.g., switch S2 in FIG. 4A) and connecting the PIN diode to the mid-voltage reverse bias power supply through a resonant network. Finally, the PIN diode is connected to forward bias current supply (operation 808) to hold the PIN diode in the forward biased (ON) state (e.g., closing of S4 in FIG. 4F).

Figure 9:
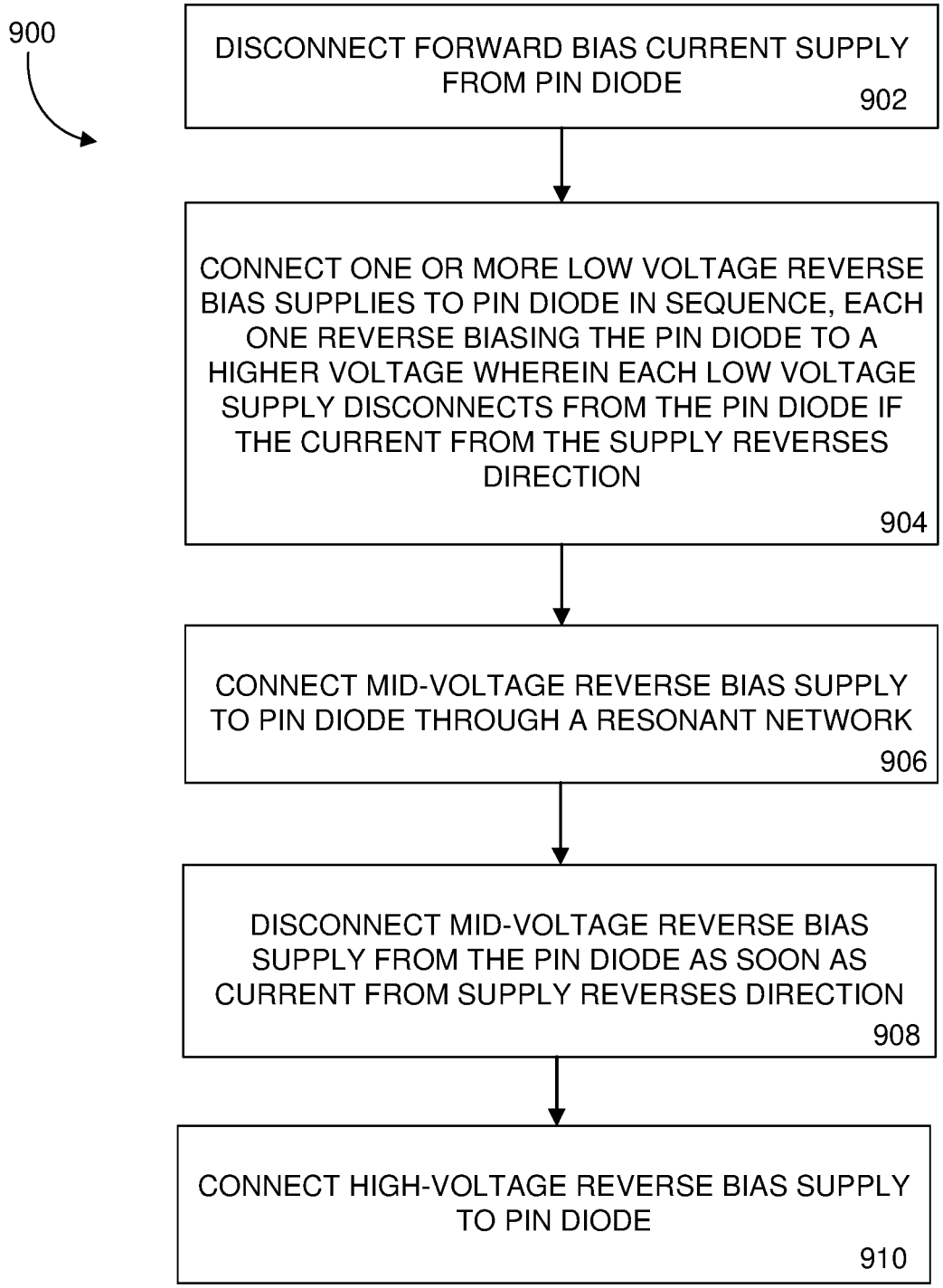
FIG. 9 is a method for controlling a two-stage PIN diode driver circuit combined with one or more low-voltage reverse bias power supplies when changing the PIN diode from a forward biased ON state to a reverse biased OFF state.

FIG. 9 shows a method 900 for controlling a two-stage PIN diode driver circuit combined with one or more low-voltage reverse bias power supplies when changing the PIN diode from a forward biased ON state to a reverse biased OFF state. The method starts with the diode in the forward biased ON state. First the PIN diode is disconnected from the forward bias current supply (operation 902) (e.g., opening S1 in FIG. 6A). Next the PIN diode is connected to one or more low voltage reverse bias power supplies (operation 904) (e.g., closing S5 FIG. 6A and then closing S5 and opening S6 in FIG. 6B). By first removing charge from the intrinsic region of the PIN diode with a low voltage reverse bias power supply the energy expended in reverse biasing the PIN diode can be further reduced. If there is more than one low voltage reverse bias power supply, then these supplies can be connected to the controlled node 612 in an increasing sequence of reverse bias voltage (e.g., S5 before S6 in FIG. 6B). The circuit is designed such that each of the low voltage reverse bias power supplies disconnects from the PIN diode if the PIN diode voltage reverse bias is higher than the voltage of the low voltage reverse bias power supply, or equivalently if the current through the low voltage reverse bias power supply reverses direction. This can be accomplished in some embodiments by diodes (e.g., diodes D5 and D6 in FIG. 6A). In other words, FIG. 9 is similar to FIG. 8 but with operation 904 inserted between 802 and 804. Next the PIN diode is connected to a mid-voltage reverse bias power supply through a resonant network (operation 906) (e.g., closing of S1). This connection to the mid-voltage reverse bias power supply through a resonant circuit causes the current drawn from the mid-voltage reverse bias power supply to increase to a maximum value before decreasing again. If this connection is maintained, the current through the mid-voltage reverse bias power supply will change direction, but this is prevented by disconnecting the PIN diode from the mid-voltage reverse bias power supply as soon as the current reverses direction (operation 908). Operation 908 can be enabled by placing a diode (e.g., diode D1 in FIG. 6A) in series with the switch (e.g., switch S1 in FIG. 6A) connecting the PIN diode to the mid-voltage reverse bias power supply through a resonant network. Finally, the PIN diode is connected to a high-voltage reverse bias power supply (operation 910) to hold the PIN diode in the reverse biased (OFF) state (e.g., closing S3).

Figure 10:
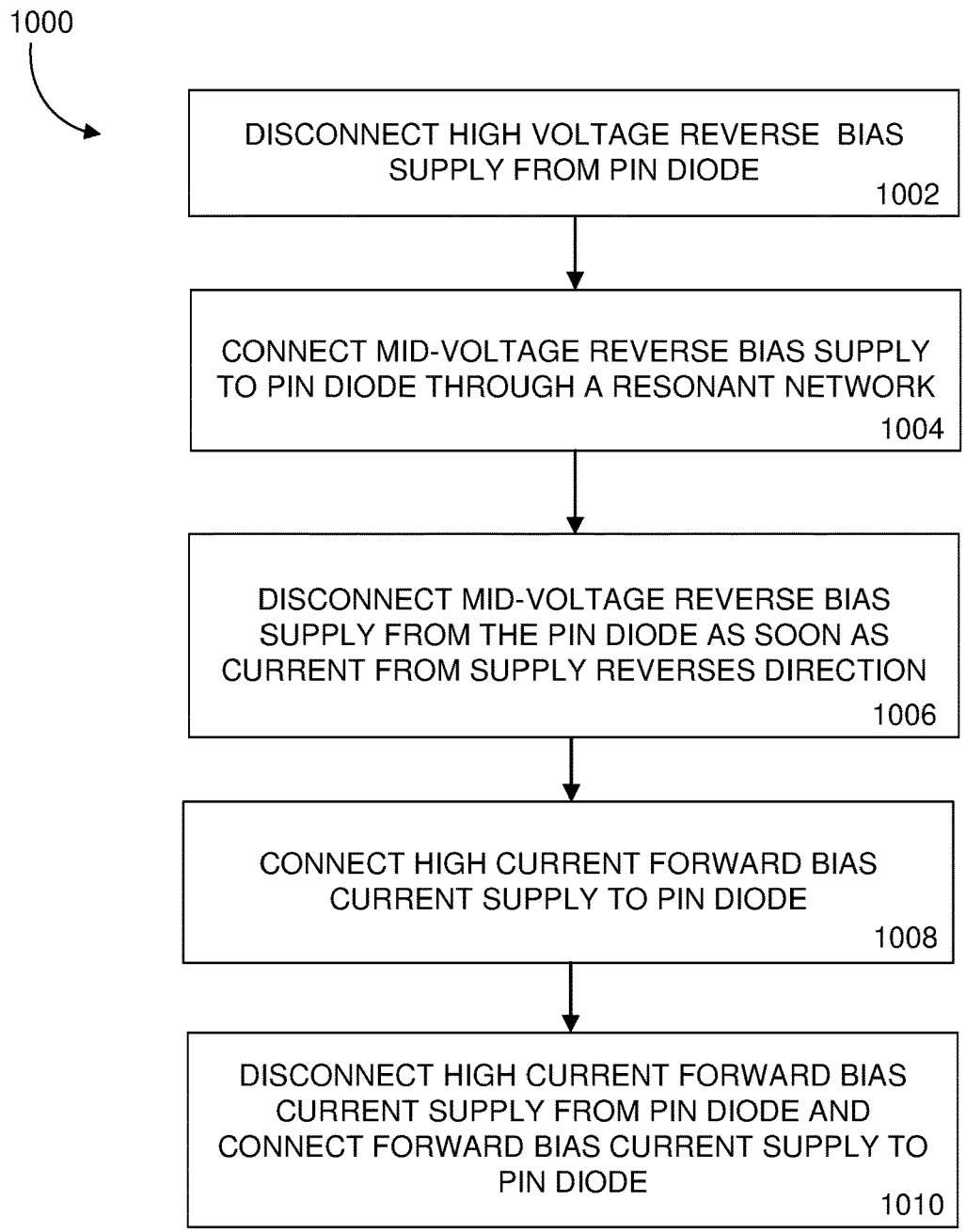
FIG. 10 is a method for controlling a two-stage PIN diode driver circuit combined with a current boost circuit when changing the PIN diode from a reverse biased OFF state to a forward biased ON state.

FIG. 10 shows a method 1000 for controlling a two-stage PIN diode driver circuit combined with a current boost circuit when changing the PIN diode from a reverse biased OFF state to a forward biased ON state. The method starts with the diode in the reverse biased OFF state. First the PIN diode is disconnected from the high voltage reverse bias power supply (operation 1002). Next the PIN diode is connected to a mid-voltage reverse bias power supply through a resonant network (operation 1004). This connection to the mid-voltage reverse bias power supply through a resonant circuit causes the current drawn from the mid-voltage reverse bias power supply to increase to a maximum value before decreasing again. If this connection is maintained, the current through the mid-voltage reverse bias power supply will change direction, but this is prevented by disconnecting the PIN diode from the mid-voltage reverse bias power supply as soon as the current reverses direction (operation 1006). Operation 1006 can be enabled by placing a diode (e.g., diode D2 in FIG. 6A) in series with the switch (e.g. switch S2 in FIG. 6A) connecting the PIN diode to the mid-voltage reverse bias power supply through a resonant network. Next the PIN diode is connected to a high current forward current supply (operation 1008). The high current forward current power supply can supply a current that is 2 to 100 times higher than the nominal forward current and the duration of the higher than nominal current can be from 1 to 100 microseconds. Both the magnitude of the current and the duration of the higher than nominal current depend on how the circuit is optimized for performance and power consumption. Finally, the PIN diode is disconnected from the high current forward bias current supply and connected to the forward bias current supply (operation 1010) to hold the PIN diode in the forward biased (ON) state.

The description of the resonant-charge discharge circuitry together with the holding circuitry described above in terms of driving a PIN diode can be generalized as the problem of repeatedly driving a node in a circuit between two voltages (e.g., V1 and V2 or V2 and V1). Especially if the load is capacitive, the methods described here are advantageous because they provide methods for doing so without having to dissipate the energy stored in the capacitive load during the discharge cycle and they provide protection against overshoot and undershoot of the voltage. In general terms then a method can be described as changing a voltage, V, of a controlled node (412 in FIG. 4 or 612 in FIG. 6) from a first voltage, $V_1$, to a second voltage, $V_2$, and from $V_2$ to $V_1$; the method to change from $V_1$ to $V_2$ comprising: disconnecting the controlled node from a first holding power supply (opening switch S4 in FIG. 4A), connecting (closing S1 in FIG. 4A) the controlled node to a mid-voltage power supply through a resonant circuit (L1 and C1 in FIG. 4 also taking into account the PIN diode 408 and RF blocking device 406), maintaining this connection until the current from the mid-voltage power supply reverses direction because of the resonant circuit, breaking this connection as soon as the current reverses direction (D1 blocking reverse current flow followed by opening S1 in FIG. 4C), and connecting (closing S3 in FIG. 4C) the controlled node to a second holding supply ($V_{high}$ in FIG. 4C) after the connection to the mid-voltage supply has been broken; and the method to change from $V_3$ to $V_1$ comprising: disconnecting the controlled node from the second holding power supply (opening switch S3 in FIG. 4D), connecting (closing switch S2 in FIG. 4D) the controlled node to the mid-voltage supply through a resonant circuit, maintaining this connection until the current from the mid-voltage power supply reverses direction because of the resonant circuit, breaking this connection as soon as the current reverses direction (D2 blocking reverse current flow followed by opening S2 in FIG. 4F), and connecting the controlled node to the first holding supply (closing S4 in FIG. 4F) after the connection to the mid-voltage supply has been broken.

In the context of this disclosure, charging of a PIN diode means increasing the cathode to anode voltage of the PIN diode, generally from around −0.7 V to some high voltage such as 1500 V, but it can also be a smaller positive voltage such as 20 V. Similarly, in the context of this disclosure, discharging of the PIN diode means decreasing the cathode to anode voltage, generally from some high voltage to around −0.7 V. Because this driver can also be used to drive capacitive loads that do not involve PIN diodes, in general charging means that energy is provided by the driver and discharging means that energy can be recovered by the driver. In some cases, the charge and discharge cycles are indistinguishable, and any one of the two cycles can be considered the charging and the other the discharging cycle. This happens when for example a capacitor is charged from −5 V to 5 V and back with a mid-voltage supply at 0 V (replaced by a ground connection), the high-voltage supply is 5 V and the low voltage supply is −5 V.

In alternative embodiments, two power supplies may be used to charge and discharge the PIN diode as disclosed in U.S. Pat. No. 10,742,212, which is incorporated herein by reference as an example of how two voltage supplies may provide a forward bias current to the PIN diode and the reverse bias voltage across the PIN diode.

In the context of a solid-state match, the RF blocking device may include inductors in series between the charge-discharge circuitry and the PIN diode, but more generally the RF blocking device may be any circuit that primarily passes direct-current (DC) at low frequencies between the charge-discharge circuitry and the PIN diode while primarily attenuating RF frequencies applied to the PIN diode by the RF circuitry. Examples of the types of circuits that may be used to implement the RF blocking device include an RF choke, a parallel resonant LC tank or tanks, a quarter wavelength (at the applied RF frequency) transmission line, etc.

As discussed above, under forward bias conditions the PIN diode stores charge in the intrinsic region. To quickly remove this charge and enable energy recovery, the first stage comprises resonant circuitry. Applicant found that this creates a dangerous situation where the PIN diode snaps off when the charge is extracted from the PIN diode, and this sudden turn-off of the current through the PIN diode creates high voltages across the PIN diode when driven through the inductor of the energy recovery component, which can lead to PIN diode failure. As compared to known systems, the holding stage, in general, prevents this dangerous voltage spike from occurring when the diode snaps off. More specifically, the holding stage functions to both to limit the voltage when the PIN diode turns off (and recovers energy in the process under some conditions) and holds the high reverse voltage and supplies the current in the ON state. Another aspect of the depicted embodiment is the current booster, which adds a current boost at turn-on to quickly re-establish carriers in the intrinsic region and to limit RF losses at turn-on.

In terms of applications, when the two-stage driver is implemented in connection with a solid-state match, multiple PIN diodes may be switched within the time window of a pulse (a power state) of an RF generator. More specifically, it is contemplated that a solid-state match may tune to states down to 50 microseconds in duration by enabling the PIN diodes to switch between the OFF and ON states in 10 microseconds or less.

Figure 11:
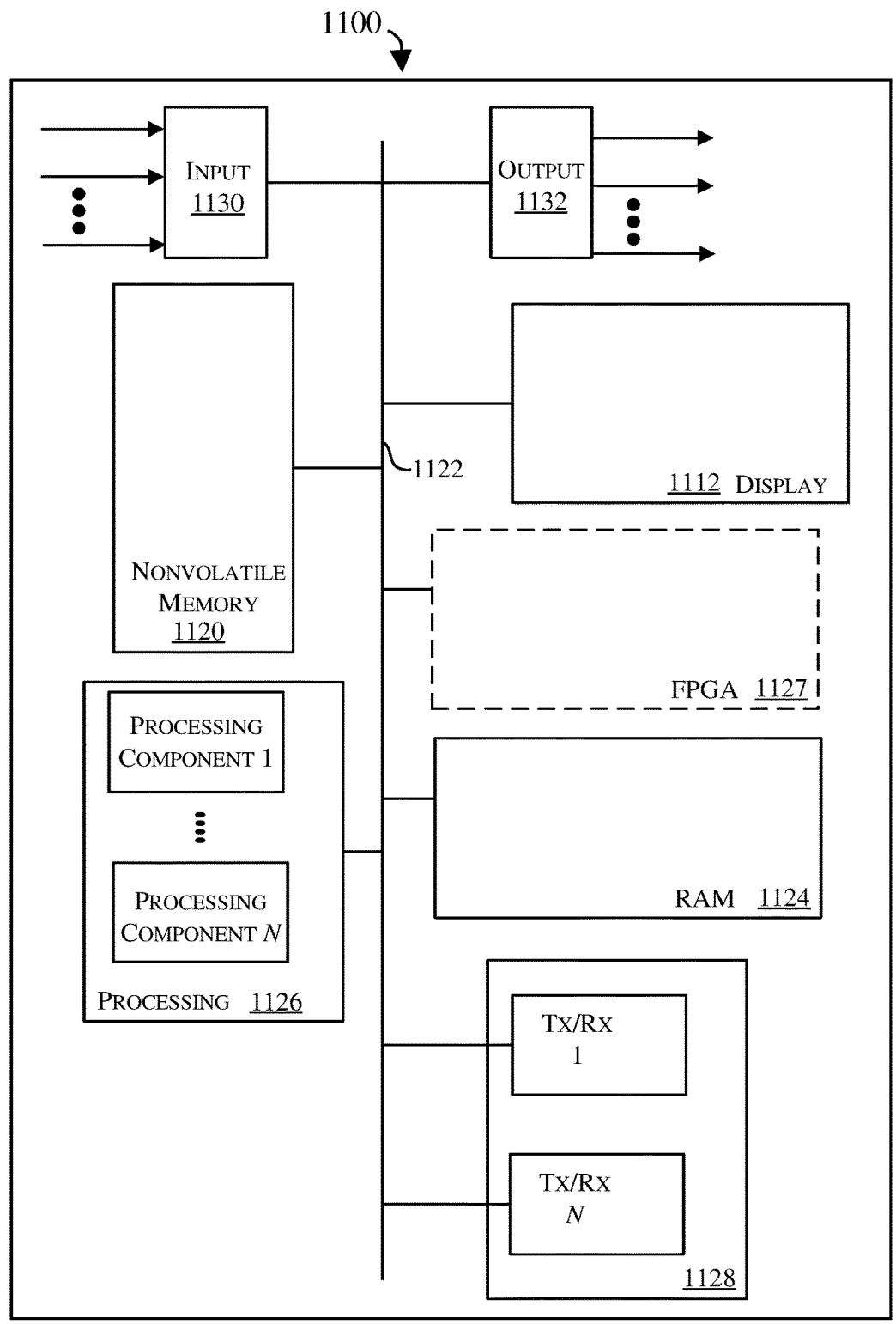
FIG. 11 is a diagram illustrating an example of a computing system which may be used in implementing embodiments of the present disclosure.

The methods described in connection with the embodiments disclosed herein may be embodied directly in hardware, in processor-executable code encoded in a non-transitory tangible processor readable storage medium, or in a combination of the two. Referring to FIG. 11 for example, shown is a block diagram depicting physical components that may be utilized to realize control of the first and second stages of FIGS. 3, 4, and 6 according to an exemplary embodiment. As shown, in this embodiment a display portion 1112 and nonvolatile memory 1120 are coupled to a bus 1122 that is also coupled to random access memory ("RAM") 1124, a processing portion (which includes N processing components) 1126, an optional field programmable gate array (FPGA) 1127, and a transceiver component 1128 that includes N transceivers. Although the components depicted in FIG. 11 represent physical components, FIG. 11 is not intended to be a detailed hardware diagram; thus many of the components depicted in FIG. 11 may be realized by common constructs or distributed among additional physical components. Moreover, it is contemplated that other existing and yet-to-be developed physical components and architectures may be utilized to implement the functional components described with reference to FIG. 11.

This display portion 1112 generally operates to provide a user interface for a user, and in several implementations, the display is realized by a touchscreen display. In general, the nonvolatile memory 1120 is non-transitory memory that functions to store (e.g., persistently store) data and processor-executable code (including executable code that is associated with effectuating the methods described herein). In some embodiments for example, the nonvolatile memory 1120 includes bootloader code, operating system code, file system code, and non-transitory processor-executable code to facilitate the execution of methods described with reference to FIGS. 7-10 described further herein.

In many implementations, the nonvolatile memory 1120 is realized by flash memory (e.g., NAND or ONENAND memory), but it is contemplated that other memory types may be utilized as well. Although it may be possible to execute the code from the nonvolatile memory 1120, the executable code in the nonvolatile memory is typically loaded into RAM 1124 and executed by one or more of the N processing components in the processing portion 1126.

The N processing components in connection with RAM 1124 generally operate to execute the instructions stored in nonvolatile memory 1120 to enable Methods to switch a PIN diode, for instance, coupling a PIN diode in and out of a match network. For example, non-transitory, processor-executable code to effectuate the methods described with reference to FIG. 7-10 may be persistently stored in nonvolatile memory 1120 and executed by the N processing components in connection with RAM 1124. As one of ordinarily skill in the art will appreciate, the processing portion 1126 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 1126 may be configured to effectuate one or more aspects of the methodologies described herein (e.g., the methods described with reference to FIGS. 7-10). For example, non-transitory processor-readable instructions may be stored in the nonvolatile memory 1120 or in RAM 1124 and when executed on the processing portion 1126, cause the processing portion 1126 to perform methods to control switching of PIN diode. Alternatively, non-transitory FPGA-configuration-instructions may be persistently stored in nonvolatile memory 1120 and accessed by the processing portion 1126 (e.g., during boot up) to configure the hardware-configurable portions of the processing portion 1126 to effectuate the functions of the first and second stages.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

What is claimed is:

1. A method for driving a PIN diode where the driving comprises changing a voltage, V, of a controlled node connected to a PIN diode from a first voltage, V1, to a second voltage, V2, and from V2 to V1, the method comprising:
changing from V1 to V2, wherein changing from V1 to V2 comprises:
disconnecting the controlled node from a first holding power supply by breaking a first connection, connecting the controlled node to a mid-voltage power supply through a first resonant circuit via a second connection, maintaining the second connection until the first resonant circuit causes the current from the mid-voltage power supply to reverse direction, breaking the second connection as soon as the current reverses direction, and connecting the controlled node to a second holding supply via a third connection after the second connection to the mid-voltage supply has been broken; and
changing from V2 to V1, wherein changing from V2 to V1 comprises:
disconnecting the controlled node from the second holding power supply by breaking the third connection, connecting the controlled node to the mid-voltage power supply through a second resonant circuit via a fourth connection, maintaining the fourth connection until the second resonant circuit causes the current from the mid-voltage power supply to reverse direction, breaking the fourth connection as soon as the current reverses direction, and connecting the controlled node to the first holding supply via the first connection after the fourth connection to the mid-voltage power supply has been broken.

2. The method of claim 1, wherein the first and second resonant circuits are the same circuit.

3. The method of claim 1, wherein the first and second resonant circuits have at least one component that is not common between them.

4. The method of claim 1, wherein in the changing from V1 to V2 the mid-voltage power supply delivers energy, and in the changing from V2 to V1 the mid-voltage power supply recovers energy.

5. The method of claim 1, wherein in the changing from V2 to V1 the mid-voltage power supply delivers energy, and in the changing from V1 to V2 the mid-voltage power supply recovers energy.

6. The method of claim 1, wherein energy is recovered to the first or second holding power supply shortly before the current from the mid-voltage power supply reverses direction.

7. The method of claim 6, wherein a power converter is connected between an output of the first holding supply and a power sink.

8. The method of claim 7, wherein the power sink is an output of the mid-voltage power supply.

9. The method of claim 6, wherein a power converter is connected between an output of the second holding supply and a power sink.

10. The method of claim 9, wherein the power sink is the output of the mid-voltage power supply.

11. The method of claim 1, wherein the controlled node is connected to the PIN diode through a radio frequency (RF) blocking circuit that provides a low impedance to direct current (DC) current and attenuates transmission of RF power through the RF blocking device.

12. The method of claim 11, further comprising, after disconnecting the controlled node from the first holding power supply and before connecting the controlled node to the mid-voltage power supply through the first resonant circuit, connecting one or more low voltage reverse bias supplies to the controlled node in a sequence of increasing voltage when changing from V1 to V2.

13. The method of claim 12, wherein each of the low voltage supplies disconnect from the controlled node if current drawn from a respective low-voltage power supply reverses direction.

14. The method of claim 12, wherein one of the one or more low voltage reverse bias supplies is at least partially coupled between the first holding supply and the controlled node.

15. The method of claim 11, wherein the RF blocking circuit connects the controlled node to a cathode of the PIN diode, the output of the first holding supply is a negative current when the first holding supply is connected to the controlled node and a negative voltage when the first holding supply is not connected to the controlled node.

16. The method of claim 15, wherein an output of the mid-voltage power supply is a positive voltage, but less positive than an output of the second holding supply.

17. The method of claim 11, wherein the RF blocking circuit connects the controlled node to an anode of the PIN diode, the output of the first holding supply is a positive current when the first holding supply is connected to the controlled node and a positive voltage when the first holding supply is not connected to the controlled node.

18. The method of claim 17, wherein an output of the mid-voltage power supply is a negative voltage, but less negative than an output of the second holding supply.

19. The method of claim 11, wherein a magnitude of current provided by the first holding supply is increased for a short time after connecting the controlled node to the first holding supply.

20. The method of claim 19, wherein the short time is between 1 microsecond and 100 microseconds, and the magnitude of the current is increased to a level between 2 and 100 times the magnitude of the current after the short time has elapsed.

21. A method for driving a PIN diode, the method comprising:
controllably charging and discharging the PIN diode to place the PIN diode in an OFF state and an ON state, respectively;
recovering stored energy when the PIN diode is discharged; and
holding a voltage across a series combination of the PIN diode and a RF blocking device with a holding supply when the PIN diode turns to the OFF state, where the RF blocking device primarily passes DC current and primarily attenuates RF power.

22. The method of claim 21, further comprising:
increasing forward current through the PIN diode above a baseline forward current for a short time after discharging the PIN diode.

23. The method of claim 21, further comprising providing one or more low voltage reverse bias supplies for charging the PIN diode from a voltage substantially lower than that of the holding supply.

24. The method of claim 21, further comprising charging and discharging the PIN diode with a single mid-voltage power supply.

25. The method of claim 24, further comprising:
recovering energy to the holding supply.

26. The method of claim 25, further comprising transferring power from the holding supply to the mid-voltage supply via a power converter.

27. The method of claim 21 wherein a capacitor is operably coupled with the PIN diode as part of a match network, the PIN diode connecting the capacitor in the match network when discharged and disconnecting the capacitor from the match network when charged, the energy recovered further including energy stored in the capacitor.

28. An apparatus comprising:
charge-discharge circuitry configured to charge and discharge a PIN diode to place the PIN diode in an OFF state and an ON state, respectively;
an energy recovery component configured to recover stored energy when the PIN diode is discharged; and
a holding stage incorporating a holding supply configured to hold a voltage across a series combination of the PIN diode and a RF blocking device when the PIN diode is in the OFF state, where the RF blocking device primarily passes DC current and primarily attenuates RF power.

29. The apparatus of claim 28, further comprising:
current boost circuitry coupled to the charge-discharge circuitry and configured to temporarily increase current through the PIN diode when transitioning to the ON state.

30. The apparatus of claim 28, further comprising a mid-voltage power supply coupled to the charge-discharge circuitry and configured to provide current to the PIN diode through the charge-discharge circuitry and the RF blocking device.

31. The apparatus of claim 30, further comprising:
recovering energy to the holding supply.

32. The apparatus of claim 31, further comprising a power converter coupled between the holding supply and the mid-voltage supply to transfer power from the holding supply to the mid-voltage supply using the energy recovered to the holding supply.

33. The apparatus of claim 28, further comprising one or more low voltage reverse bias supplies for charging the PIN diode from a voltage substantially lower than that of the holding supply.

34. The apparatus of claim 28, further comprising a capacitor operably coupled with the PIN diode as part of a match network, the PIN diode connecting the capacitor in the match network when discharged and disconnecting the capacitor from the match network when charged, the energy recovered further including energy stored in the capacitor.

35. The apparatus of claim 28, the holding stage further comprising a second holding supply configured to conduct current through the PIN diode and a RF blocking device when the PIN diode turns to the on state.

36. A non-transitory, tangible processor-readable storage medium, encoded with processor readable instructions to perform a method for driving a PIN diode, the method comprising:
charging and discharging a PIN diode to place the PIN diode in an OFF state and an ON state, respectively;
recovering stored energy when the PIN diode is discharged; and
holding a voltage across a series combination of the PIN diode and a RF blocking device when the PIN diode is in the OFF state, where the RF blocking device primarily passes DC current and primarily attenuates RF power.

37. The non-transitory, tangible processor-readable storage medium of claim 36, wherein the method further comprises, during the ON state of the PIN diode, providing a first current to the PIN diode via a resonant circuit to transition the PIN diode to the OFF state, and then holding the voltage across the PIN diode to maintain a reverse bias voltage on the PIN diode.

38. The non-transitory, tangible processor-readable storage medium of claim 36, wherein the method further comprises holding the voltage across the series combination of the PIN diode and the RF blocking device using a higher voltage supply than a one performing the charging and discharging of the PIN diode.

39. The non-transitory, tangible processor-readable storage medium of claim 36, wherein the method further comprises recovering the stored energy through a holding supply configured to perform the holding the voltage across the series combination of the PIN diode and the RF blocking device.

40. The non-transitory, tangible processor-readable storage medium of claim 36, wherein the method further comprises boosting current after discharging the PIN diode.

41. The non-transitory, tangible processor-readable storage medium of claim 40, wherein the method further comprises, during the OFF state of the PIN diode, drawing a second current from the PIN diode via the resonant circuit to transition the PIN diode to the ON state, and then holding the second current from the PIN diode to maintain a forward bias on the PIN diode.

* * * * *